United States Patent
Kong et al.

(10) Patent No.: US 11,764,254 B2
(45) Date of Patent: *Sep. 19, 2023

(54) DISPLAY APPARATUS

(71) Applicant: SAMSUNG ELECTRONICS CO., LTD., Suwon-si (KR)

(72) Inventors: Kiho Kong, Suwon-si (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/744,156

(22) Filed: May 13, 2022

(65) Prior Publication Data

US 2022/0271086 A1 Aug. 25, 2022

Related U.S. Application Data

(63) Continuation of application No. 16/790,206, filed on Feb. 13, 2020, now Pat. No. 11,362,136.

(30) Foreign Application Priority Data

Aug. 19, 2019 (KR) .................. 10-2019-0101132

(51) Int. Cl.
*H01L 27/14* (2006.01)
*H01L 27/15* (2006.01)
(Continued)

(52) U.S. Cl.
CPC .......... *H01L 27/156* (2013.01); *H01L 27/124* (2013.01); *H01L 27/1255* (2013.01);
(Continued)

(58) Field of Classification Search
CPC . H01L 27/156; H01L 27/124; H01L 27/1255; H01L 28/60; H01L 33/36;
(Continued)

(56) References Cited

U.S. PATENT DOCUMENTS 6,770,908 B2  8/2004  Sato
7,742,027 B2  6/2010  Yamashita et al.
(Continued)

FOREIGN PATENT DOCUMENTS

KR  10-2004-0061256 A  7/2004
KR     10-0442217 B1   7/2004
(Continued)

OTHER PUBLICATIONS

Communication dated Jan. 22, 2021, issued by the European Patent Office in counterpart European Application No. 20188152.1.

*Primary Examiner* — Tan N Tran
(74) *Attorney, Agent, or Firm* — Sughrue Mion, PLLC

(57) ABSTRACT

A display apparatus includes a substrate, a light-emitting device provided on the substrate, a driving transistor device configured to control the light-emitting device, a first power supply line electrically connected to a source region of the driving transistor device, a conductive pattern electrically connected to a gate electrode of the driving transistor device, and a second power supply line electrically connected to the first power supply line, wherein the conductive pattern and the first power supply line constitute a first capacitor, and the conductive pattern and the second power supply line constitute a second capacitor, wherein the first capacitor and the second capacitor are connected in parallel.

20 Claims, 19 Drawing Sheets

(51) Int. Cl.
*H01L 27/12* (2006.01)
*H01L 49/02* (2006.01)
*H01L 33/36* (2010.01)
*H01L 33/62* (2010.01)
H01L 33/06 (2010.01)
H01L 33/32 (2010.01)
H01L 33/44 (2010.01)

(52) U.S. Cl.
CPC .............. *H01L 28/60* (2013.01); *H01L 33/36* (2013.01); *H01L 33/62* (2013.01); H01L 27/127 (2013.01); H01L 27/1222 (2013.01); H01L 33/06 (2013.01); H01L 33/32 (2013.01); H01L 33/44 (2013.01)

(58) Field of Classification Search
CPC ... H01L 33/62; H01L 27/1222; H01L 27/127; H01L 33/06; H01L 33/32; H01L 33/44; H01L 27/1259; G09F 9/33; G09G 3/32
USPC ..................................... 257/59, 72
See application file for complete search history.

(56) References Cited

U.S. PATENT DOCUMENTS

| | | | |
|---|---|---|---|
| 8,310,476 | B2 | 11/2012 | Ozawa |
| 8,441,018 | B2 | 5/2013 | Lee et al. |
| 8,669,574 | B2 | 3/2014 | Konsek et al. |
| 9,257,605 | B2 | 2/2016 | Seo et al. |
| 9,484,492 | B2 | 11/2016 | Bour et al. |
| 9,595,637 | B2 | 3/2017 | Kum et al. |
| 9,601,659 | B2 | 3/2017 | Bour et al. |
| 10,971,062 | B2 * | 4/2021 | Agostinelli .......... G09G 3/3233 |
| 2002/0135312 | A1 | 9/2002 | Koyama |
| 2003/0122497 | A1 | 7/2003 | Ko et al. |
| 2003/0128173 | A1 | 7/2003 | Ko |
| 2013/0235020 | A1 | 9/2013 | Kim et al. |
| 2013/0307833 | A1 | 11/2013 | Lee et al. |

FOREIGN PATENT DOCUMENTS

| | | |
|---|---|---|
| KR | 10-0730154 B1 | 6/2007 |
| KR | 10-2013-0128935 A | 11/2013 |
| KR | 10-1666836 B1 | 10/2016 |

* cited by examiner

DISPLAY APPARATUS

CROSS-REFERENCE TO RELATED APPLICATION(S)

This application is a Continuation application of U.S. application Ser. No. 16/790,206, filed Feb. 13, 2020, which is based on and claims priority from Korean Patent Application No. 10-2019-0101132, filed on Aug. 19, 2019, in the Korean Intellectual Property Office, the disclosure of which is incorporated herein in its entirety by reference.

BACKGROUND

1. Field

The disclosure relates to a display apparatus.

2. Description of the Related Art

Liquid crystal displays (LCDs) and organic light-emitting diode (OLED) displays are widely used as display apparatuses. Recently, technology for manufacturing a high resolution display apparatus by using a micro-light-emitting diode (LED) has been in the spotlight. However, high-efficiency small LED chips need to be manufactured in order to manufacture a high-resolution display apparatus by using a micro-LED, and high-level transfer technology is required in order to arrange the small LED chips at appropriate positions on the display apparatus.

SUMMARY

According to an aspect of the disclosure, electrical characteristics of a display apparatus may be improved.

Additional aspects will be set forth in part in the description which follows and, in part, will be apparent from the description, or may be learned by practice of the exemplary embodiments of the disclosure.

According to an aspect of the disclosure, a display apparatus comprising: a substrate; a light-emitting device provided on the substrate; a driving transistor provided on the substrate and configured to control the light-emitting device; a first power supply line provided on the substrate and electrically connected to a source region of the driving transistor; a conductive pattern provided on the substrate and electrically connected to a gate electrode of the driving transistor; and a second power supply line provided on the substrate and electrically connected to the first power supply line, wherein the conductive pattern and the first power supply line constitute a first capacitor, wherein the conductive pattern and the second power supply line constitute a second capacitor, and wherein the first capacitor and the second capacitor are connected in parallel.

The conductive pattern may be provided between the first power supply line and the second power supply line.

The light-emitting device may comprise: a lower semiconductor layer provided on the substrate; an upper semiconductor layer provided on the lower semiconductor layer; an emission layer provided between the lower semiconductor layer and the upper semiconductor layer; and an anode provided on the upper semiconductor layer, wherein the anode overlaps the second power supply line in a direction parallel to a top surface of the substrate.

The anode may extend along a top surface of the upper semiconductor layer and has an opening that exposes the top surface of the upper semiconductor layer.

The anode may entirely cover a top surface of the upper semiconductor layer.

The driving transistor may comprise an active pattern comprising the source region and a drain region, wherein, in a direction perpendicular to a top surface of the substrate, the active pattern and the second power supply line may be spaced apart from each other.

The display apparatus may further comprise a data line extending in a direction parallel to the first power supply line, wherein, in a direction perpendicular to a top surface of the substrate, the conductive pattern may be spaced apart from the data line.

The display apparatus may further comprise a data line extending in a direction parallel to the first power supply line, wherein the conductive pattern may overlap the data line in a direction perpendicular to a top surface of the substrate.

In the direction perpendicular to the top surface of the substrate, the conductive pattern may cross the data line.

The display apparatus may further comprise: a data line provided on the substrate and extending in a first direction parallel to a top surface of the substrate; a scan line provided on the substrate and extending in a second direction intersecting the first direction; and a switching transistor device provided in an area of the substrate where the data line and the scan line intersect each other, wherein the data line may be electrically connected to a source region of the switching transistor device, the scan line is electrically connected to a gate electrode of the switching transistor device, and the conductive pattern may be electrically connected to a drain region of the switching transistor device.

In a third direction perpendicular to the top surface of the substrate, the second power supply line may be spaced apart from the scan line.

The second power supply line may overlap the scan line in a third direction perpendicular to the top surface of the substrate.

In the third direction perpendicular to the top surface of the substrate, the second power supply line may cross the scan line.

A width of a portion of the conductive pattern may be the same as a width of the second power supply line overlapping the portion of the conductive pattern in a direction perpendicular to a top surface of the substrate.

According to another aspect of the disclosure, there is provided a display apparatus comprising: sub-pixels arranged in a matrix form, wherein each of the sub-pixels comprises: a light-emitting device; a driving transistor configured to control the light-emitting device; a first power supply line extending in a first direction; and a second power supply line extending in a second direction different from the first direction, wherein the first power supply line is electrically connected to a source region of the driving transistor, and wherein, in a third direction perpendicular to the first and the second direction, the second power supply line is between the driving transistor and the light-emitting device, and the second power supply line is electrically connected to the first power supply line.

Each of the sub-pixels further may comprise a conductive pattern electrically connected to a gate electrode of the driving transistor, wherein, in the third direction, the conductive pattern may be between the first power supply line and the second power supply line.

The conductive pattern and the first power supply line may face each other to constitute a first capacitor, wherein the conductive pattern and the second power supply line may face each other to constitute a second capacitor, and wherein the first capacitor and the second capacitor may be connected in parallel.

The conductive pattern may overlap at least one of the first power supply line and the second power supply line in the third direction.

One pair of sub-pixels, from among the sub-pixels, that are adjacent to each other in the second direction may share one first power supply line.

The second power supply line may comprise a protrusion extending in the first direction, wherein the protrusion may be provided in a first pair of sub-pixels, from among the sub-pixels, that are adjacent to each other in the second direction.

The protrusion may be provided in a second pair of sub-pixels, from among the sub-pixels, that are adjacent to each other in the first direction.

The protrusion may be provided between light-emitting devices of the first pair of sub-pixels that are adjacent to each other in the second direction.

The light-emitting device may comprise: a lower semiconductor layer; an upper semiconductor layer provided on the lower semiconductor layer; an active layer provided between the lower semiconductor layer and the upper semiconductor layer; and an anode provided on the upper semiconductor layer, wherein the anode and the protrusion overlap each other in the second direction.

The anode and the second power supply line may be located at a same level.

According to another aspect of the disclosure, there is provided a display apparatus comprising: a substrate; a plurality of light-emitting areas overlapping the substrate in a first direction perpendicular to a top surface of the substrate; a plurality of non-emitting areas respectively provided between the plurality of light-emitting areas; a plurality of anodes provided in the light-emitting areas; and a plurality of first power supply lines provided in the non-emitting areas, wherein the plurality of anodes extend into the non-emitting areas, and wherein one or more of the plurality of anodes and one or more of the plurality of first power supply lines overlap each other in a second direction parallel to the top surface of the substrate.

The display apparatus may further comprise: a plurality of driving transistors configured to respectively control the plurality of light-emitting areas; and a plurality of conductive patterns respectively connected to gate electrodes of the plurality of driving transistors, wherein the plurality of first power supply lines overlap the plurality of conductive patterns in the first direction.

The display apparatus may further comprise a plurality of second power supply lines electrically connected to source regions of the plurality of driving transistors, wherein the plurality of first power supply lines may overlap the plurality of conductive patterns in the first direction.

The plurality of second power supply lines may be respectively electrically connected to source regions of one pair of the plurality of driving transistors that are adjacent to each other.

Each of the plurality of driving transistors may comprise an active pattern where a source region and a drain region are provided, wherein, in the first direction, the plurality of first power supply lines may be spaced apart from the active patterns.

According to another aspect of the disclosure, there is provided a semiconductor device comprising: a substrate; a transistor provided on the substrate; a first power supply line provided on a first layer of the substrate and electrically connected to a source region of the transistor; a conductive pattern electrically provided on a second layer of the substrate and electrically connected to a gate electrode of the transistor; and a second power supply line provided on a third layer of the substrate and electrically connected to the first power supply line.

The conductive pattern and the first power supply line may constitute a first capacitor, and wherein the conductive pattern and the second power supply line may constitute a second capacitor.

The first capacitor and the second capacitor may be connected in parallel.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
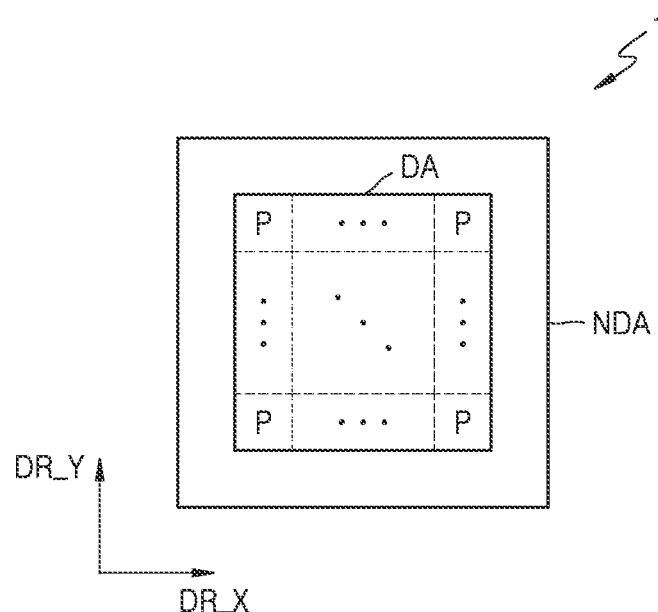
FIG. 1 is a conceptual diagram of a display apparatus according to an exemplary embodiment of the disclosure.

Reference will now be made in detail to one or more exemplary embodiments, which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The disclosure will now be described more fully with reference to the accompanying drawings, in which one or more exemplary embodiments of the disclosure are shown. In the drawings, the same reference numerals denote the same elements and sizes of components may be exaggerated for clarity and convenience of explanation. Also, exemplary embodiments are described, and various modifications may be made from the exemplary embodiments.

For example, when an element is referred to as being "on" another element, the element may be directly on the other element or may be indirectly on the other element with intervening elements therebetween.

As used herein, the singular forms "a," "an," and "the" are intended to include the plural forms as well, unless the context clearly indicates otherwise. Throughout the specification, when a portion "includes" an element, another element may be further included, rather than excluding the existence of the other element, unless otherwise described.

Terms such as " . . . unit" refer to units that perform at least one function or operation, and the units may be implemented as hardware or software or as a combination of hardware and software.

Figure 2:
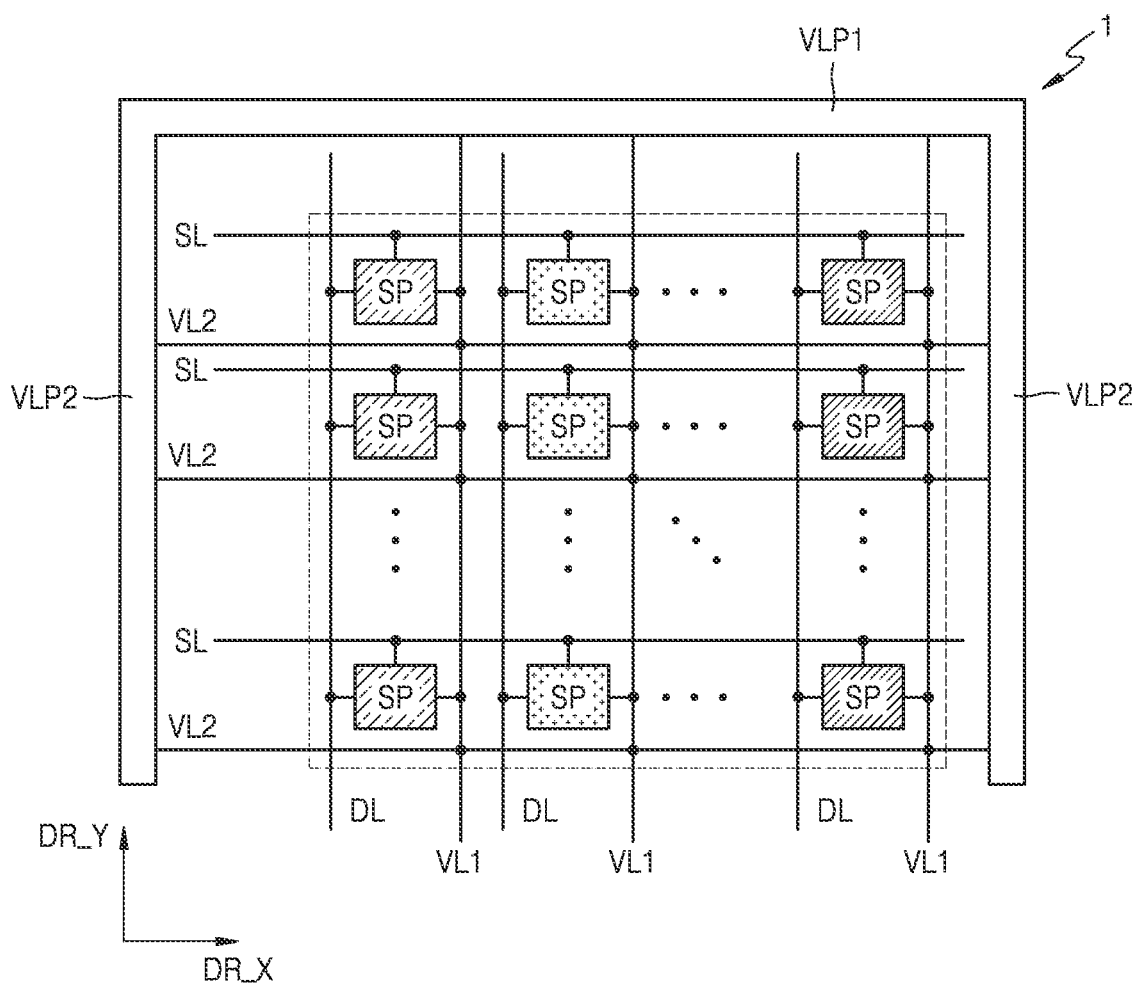
FIG. 2 is a detailed conceptual diagram of the display apparatus of FIG. 1.
Figure 3:
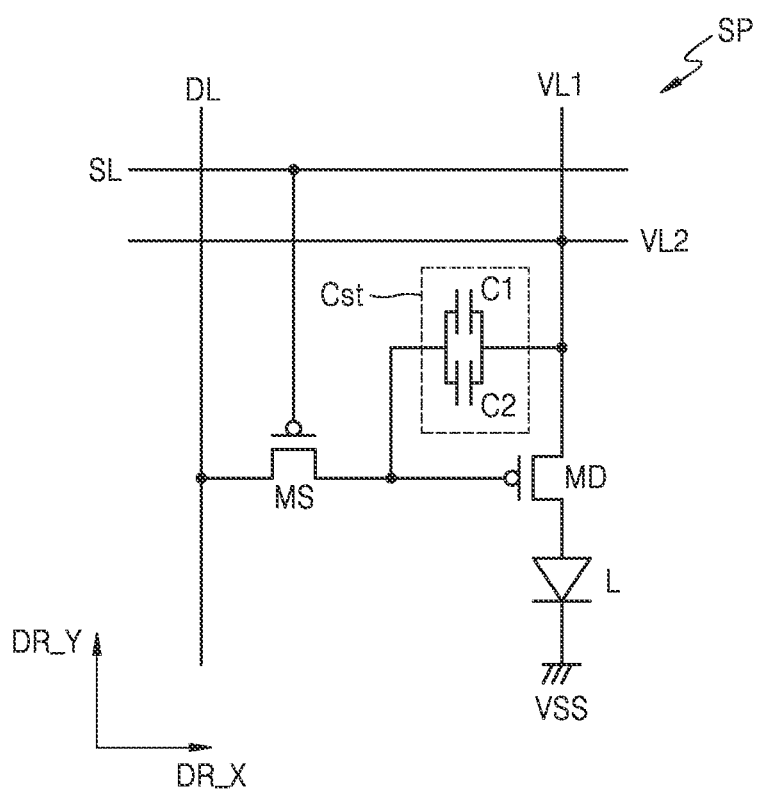
FIG. 3 is a circuit diagram of a sub-pixel in the display apparatus of FIG. 1.

FIG. 1 is a conceptual diagram of a display apparatus according to an embodiment of the present disclosure. FIG. 2 is a detailed conceptual diagram of the display apparatus of FIG. 1. FIG. 3 is a circuit diagram of a sub-pixel in the display apparatus of FIG. 1.

Referring to FIGS. 1 through 3, a display apparatus 1 according to an exemplary embodiment may include a display area DA and a non-display area NDA. The display area DA may be an area where an image is displayed. The display area DA may include pixels P for displaying an image. The pixels P may include sub-pixels SP that emit light of different colors.

The display apparatus 1 may include the sub-pixels SP, a first power supply line pad VLP1, a second power supply line pad VLP2, a scan driver, a data driver, and a processor. The sub-pixels SP may be provided in the display area DA. For example, the sub-pixels SP may be arranged in an X-direction DR_X and a Y-direction DR_Y. For example, the sub-pixels SP may be arranged in a matrix form. The scan driver, the data driver, the first power supply line pad VLP1, the second power supply line pad VLP2, and the processor may be provided in the non-display area NDA.

The scan driver may generate a scan signal for forming a channel of a switching transistor. The data driver may generate a data signal for forming a channel of a driving transistor. The first power supply line pad VLP1 and the second power supply line pad VLP2 may have a driving voltage for driving an emission unit. The processor may generate RGB image data that is digital image data by itself or based on an external image signal.

Each of the sub-pixels SP may include a scan line SL, a data line DL, a first power supply line VL1, a second power supply line VL2, a switching transistor MS, a driving transistor MD, a storage capacitor Cst, and an emission unit L. However, the number of transistors and capacitors included in the sub-pixel SP are not limited to thereto.

An anode of the emission unit L may be electrically connected to a drain electrode of the driving transistor MD. The amount of current of the driving transistor MD may be controlled by a data signal applied through the switching transistor MS. In this case, the storage capacitor Cst for maintaining an applied voltage for a certain period of time may be connected between a source electrode and a gate electrode of the driving transistor MD.

The storage capacitor Cst may include a first capacitor C1 and a second capacitor C2. The first and second capacitors C1 and C2 may be connected in parallel. A capacitance of the storage capacitor Cst may be a sum of a capacitance of the first capacitor C1 and a capacitance of the second capacitor C2.

A cathode of the emission unit L may be electrically connected to a ground power supply VSS. The emission unit L may generate light in response to current supplied from the driving transistor MD. For example, the emission unit L may include a micro-light-emitting diode (LED).

The sub-pixel SP may be controlled by the amount of current supplied from the first power supply line VL1 through the emission unit L to the ground power supply VSS in response to a data signal. Light may be emitted from a light-emitting area.

The scan lines SL may be provided in the display area DA and may extend from the scan driver into the display area DA. The scan lines SL may receive a scan signal from the scan driver and may transmit the scan signal to the sub-pixels SP. The scan lines SL may extend in the X-direction DR_X.

The data lines DL may be provided in the display area DA and may extend from a data driver into the display area DA. The data lines DL may receive a data signal from the data driver and may transmit the data signal to the sub-pixels SP. In this case, the data lines DL may transmit a data signal to the sub-pixels SP in response to a scan signal. The data lines DL may extend in the Y-direction DR_Y that intersects the X-direction DR_X.

The first power supply lines VL1 may be provided in the display area DA and may extend from the first power supply line pad VLP1 into the display area DA. The first power supply lines VL1 may extend in the Y-direction DR_Y. The second power supply lines VL2 may be provided in the display area DA and may extend from the second power supply line pad VLP2 into the display area DA. The second power supply lines VL2 may extend in the X-direction DR_X.

The sub-pixels SP may be defined by the scan lines SL and the data lines DL that intersect each other. Each sub-pixel SP may be provided at the intersection of one scan line S and one data line D.

Although the first power supply lines VL1 are respectively connected to the sub-pixels SP arranged in the X-direction DR_X, this is merely an example. In another example, one first power supply line VL1 may be provided for one pair of sub-pixels SP arranged in the X-direction DR_X. In other words, one pair of sub-pixels SP adjacent to each other in the X-direction DR_X may share one first power supply line VL1.

Figure 4:
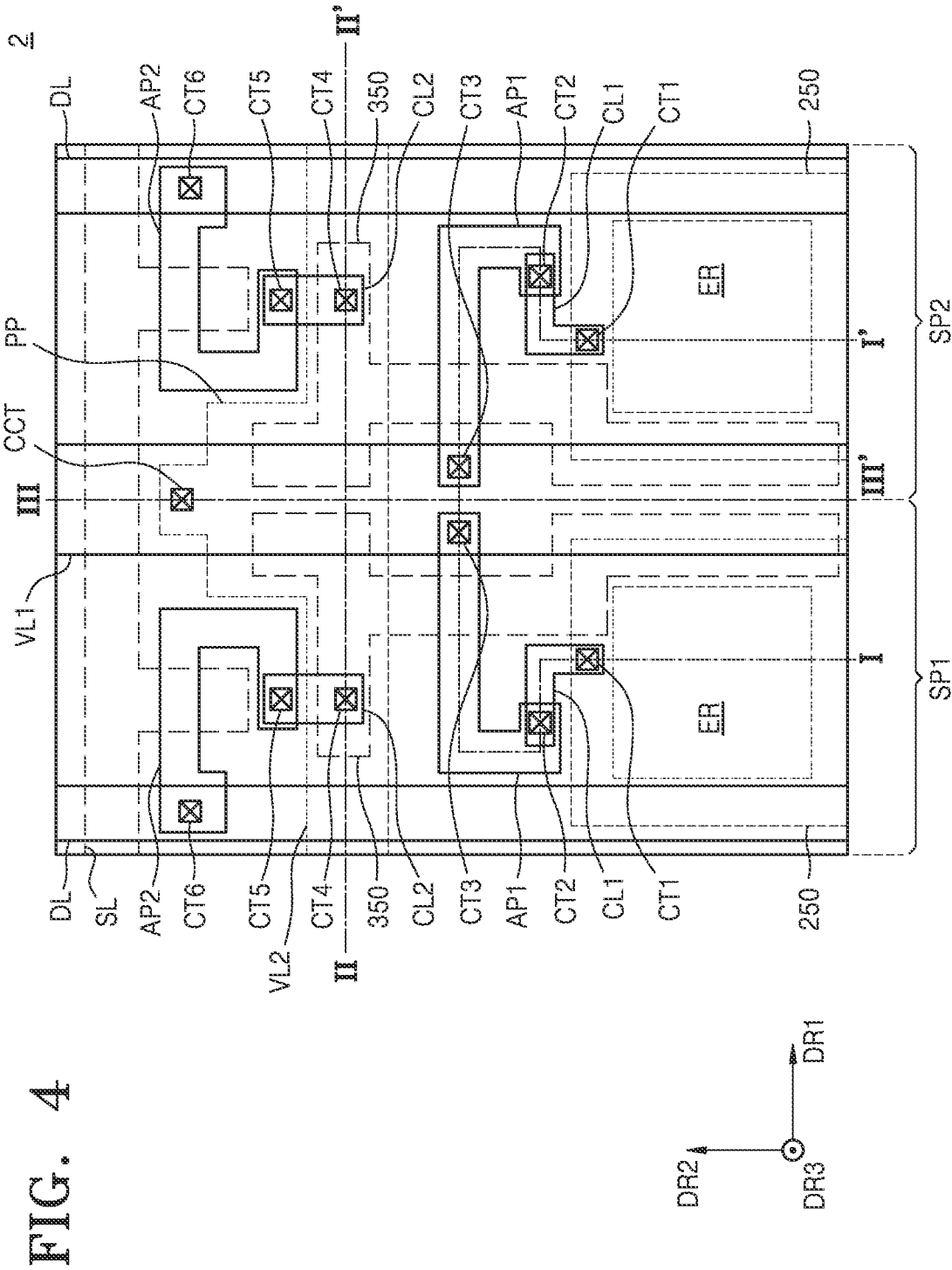
FIG. 4 is a plan view of a display apparatus according to an exemplary embodiment.
Figure 5:
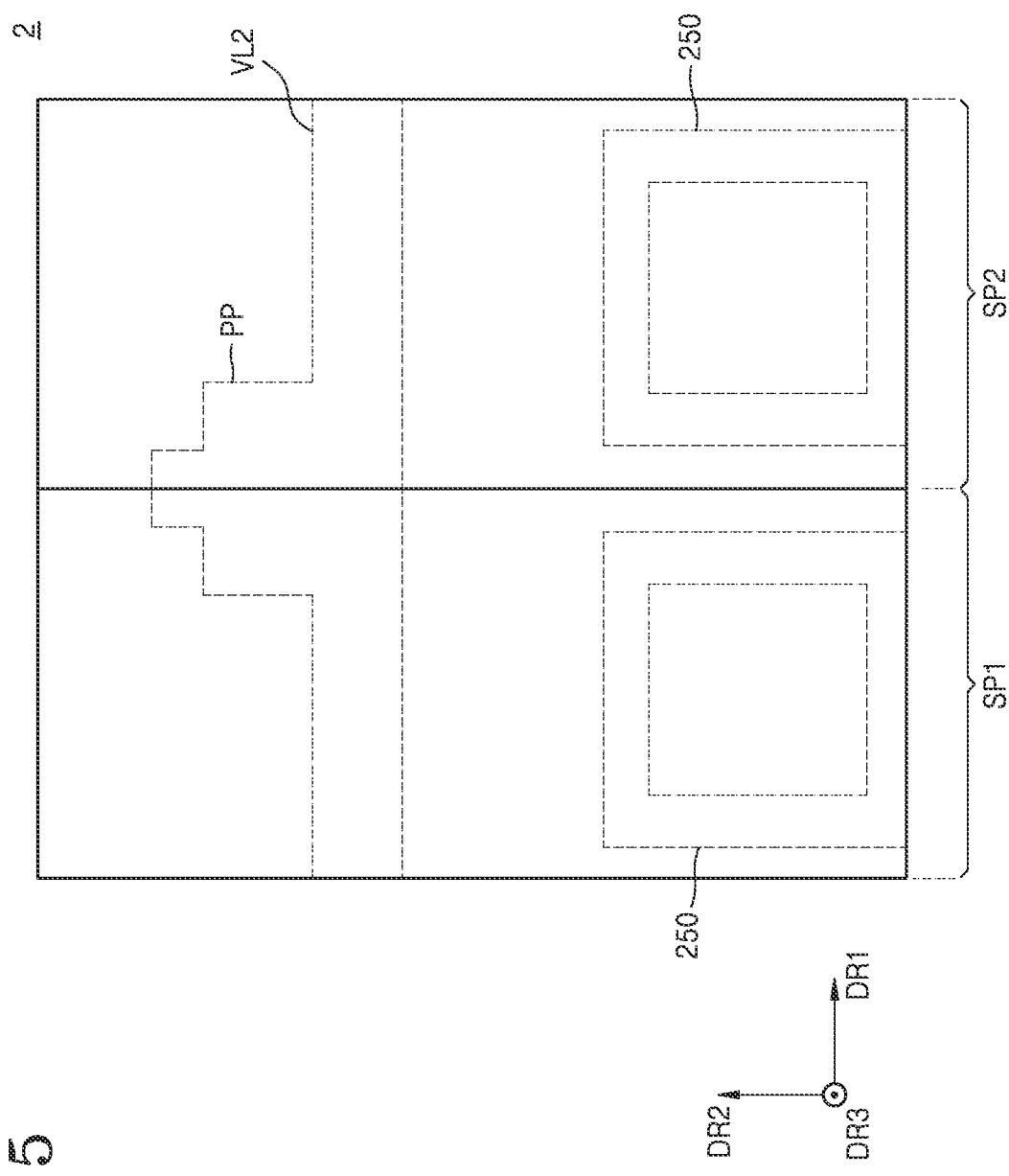
FIG. 5 is a plan view for describing an anode and a second power supply line of the display apparatus of FIG. 4.
Figure 6:
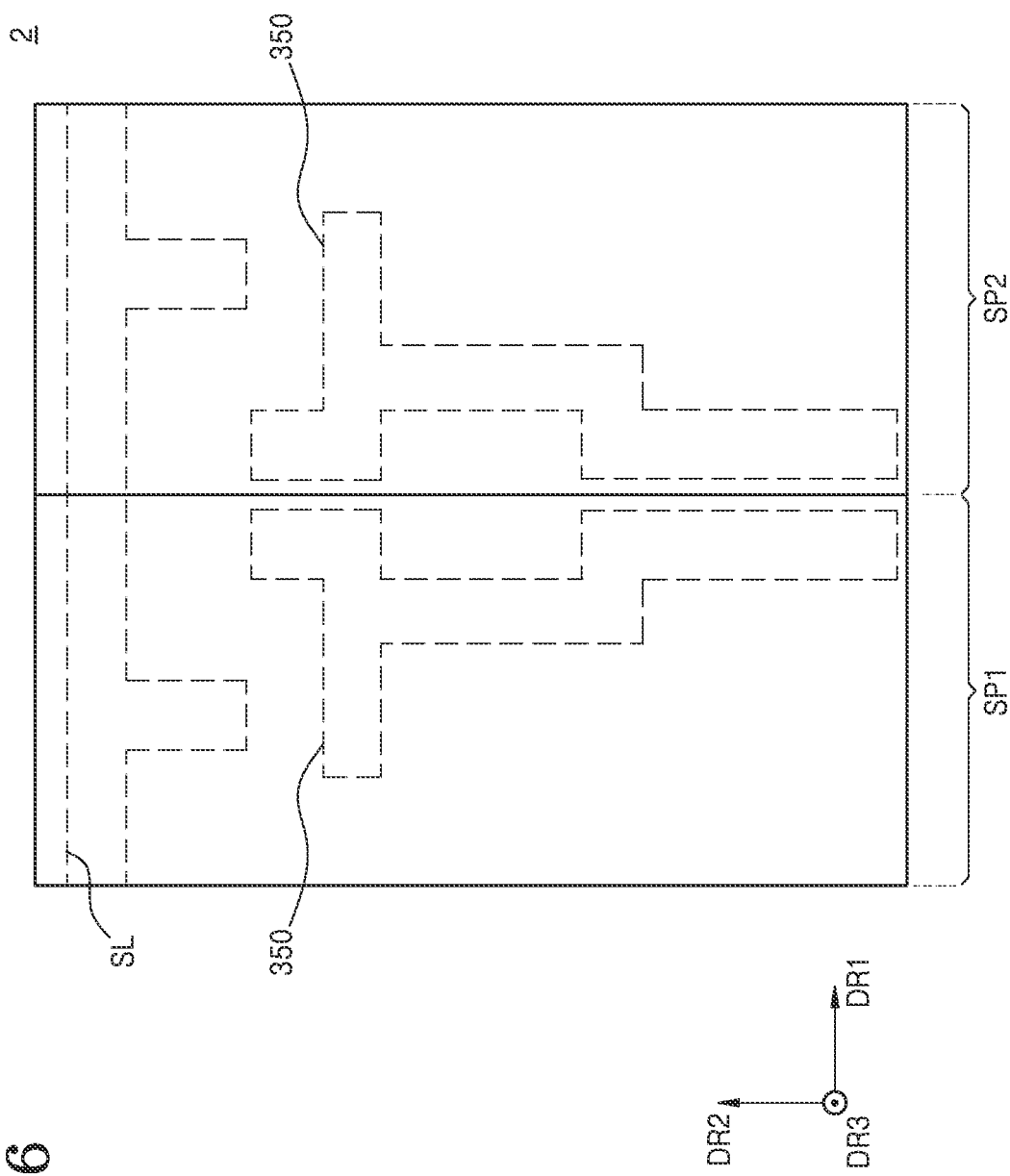
FIG. 6 is a plan view for describing a scan line and a conductive pattern of the display apparatus of FIG. 4.
Figure 7:
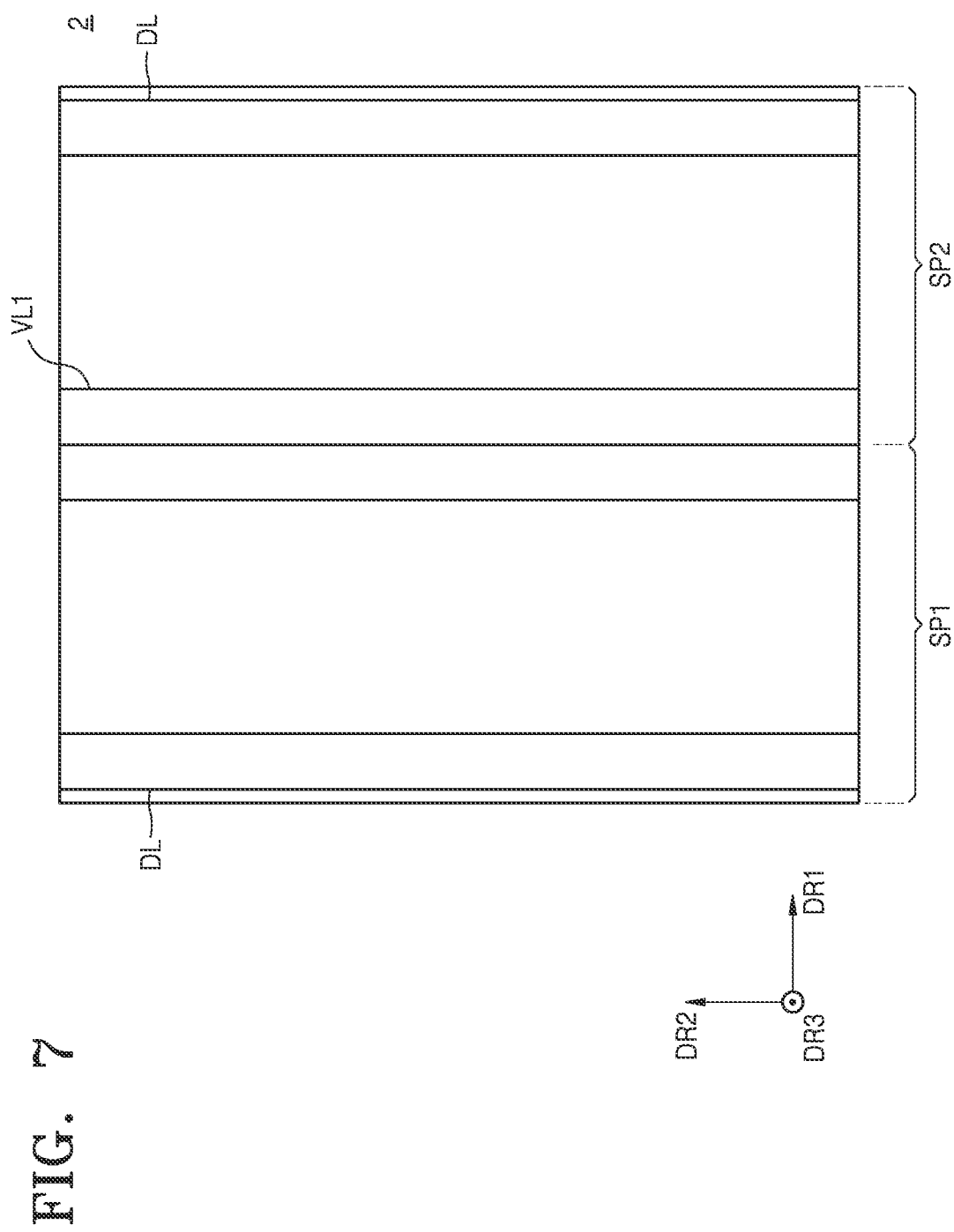
FIG. 7 is a plan view for describing a first power supply line and a data line of the display apparatus of FIG. 4.
Figure 8:
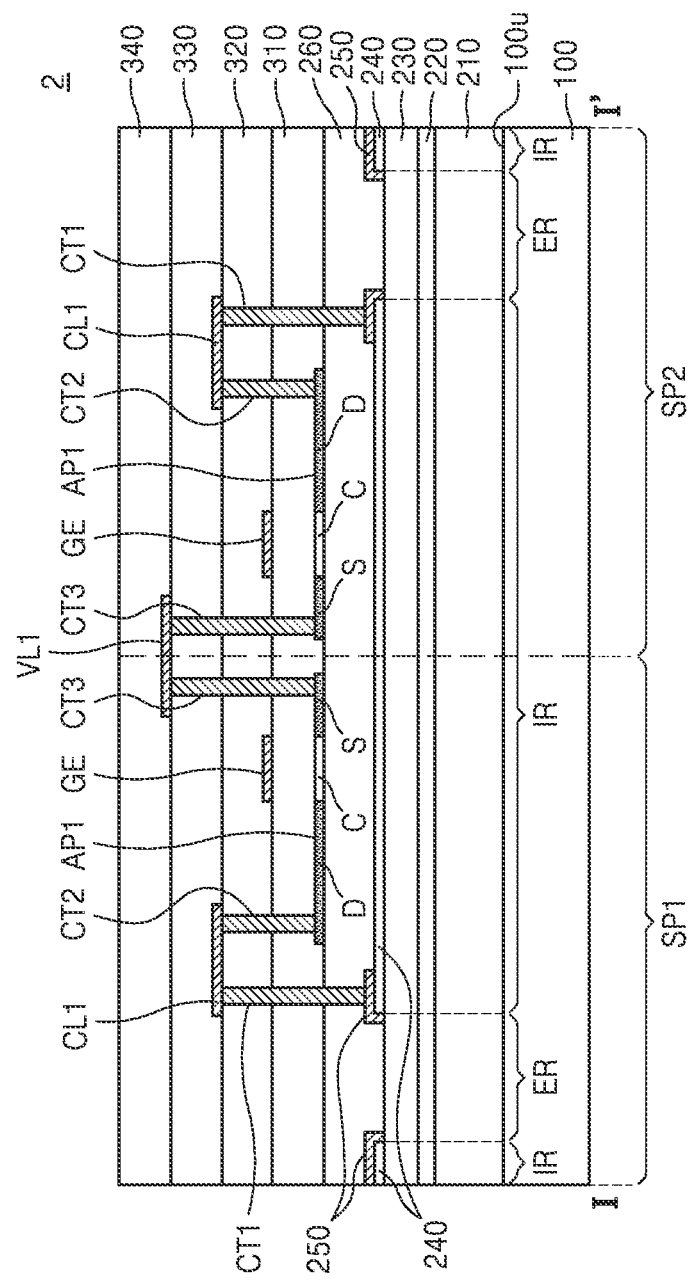
FIG. 8 is a cross-sectional view taken along line I-I' of FIG. 4.
Figure 9:
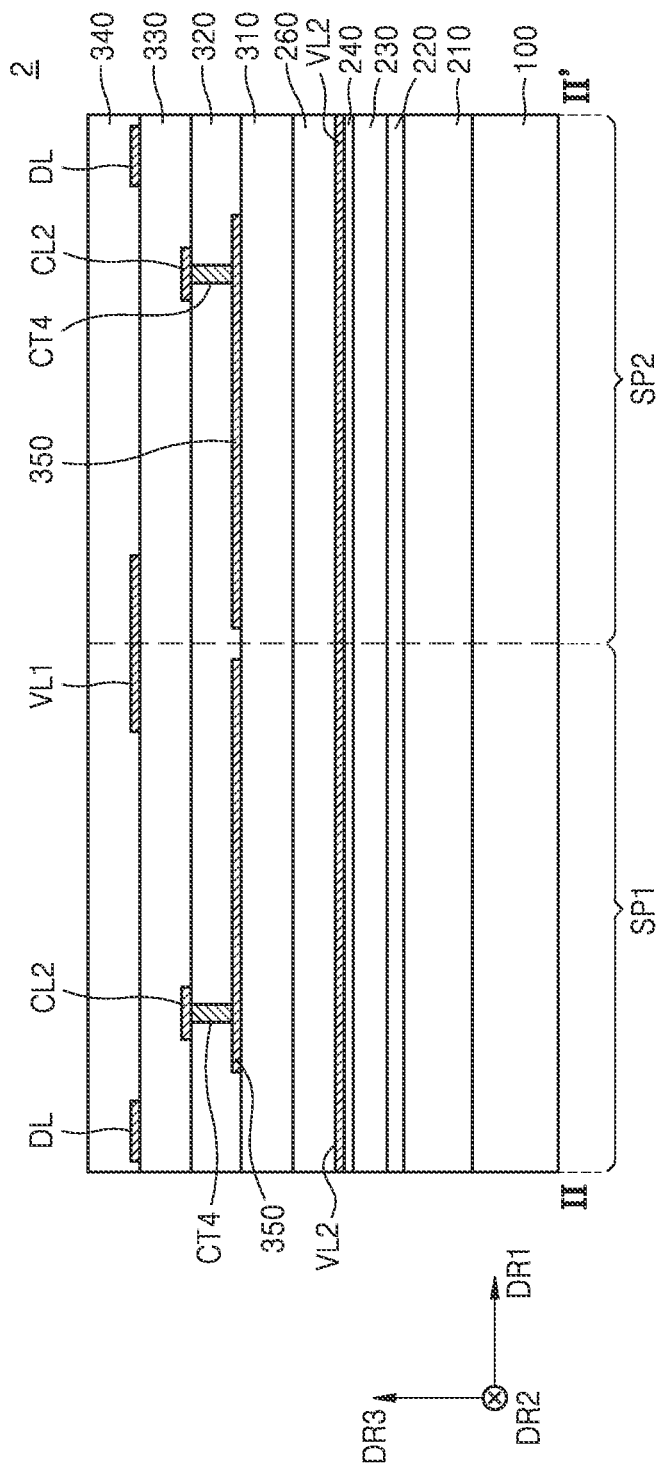
FIG. 9 is a cross-sectional view taken along line II-II' of FIG. 4.
Figure 10:
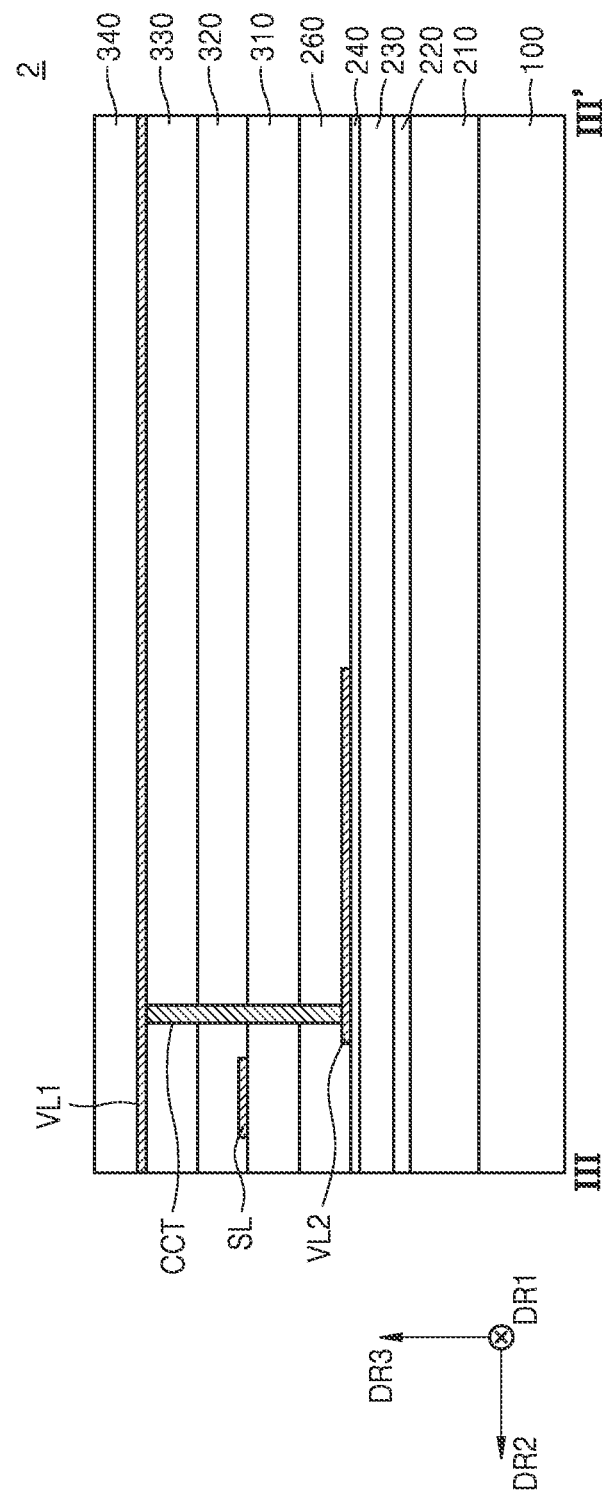
FIG. 10 is a cross-sectional view taken along line III-III' of FIG. 4.

FIG. 4 is a plan view of a display apparatus according to an exemplary embodiment. FIG. 5 is a plan view for describing an anode and a second power supply line of the display apparatus of FIG. 4. FIG. 6 is a plan view for describing a scan line and a conductive pattern of the display apparatus of FIG. 4. FIG. 7 is a plan view for describing a first power supply line and a data line of the display apparatus of FIG. 4. FIG. 8 is a cross-sectional view taken along line I-I' of FIG. 4. FIG. 9 is a cross-sectional view taken along line II-II' of FIG. 4. FIG. 10 is a cross-sectional view taken along line III-III' of FIG. 4.

Referring to FIGS. 4 through 10, a display apparatus 2 including a first sub-pixel SP1 and a second sub-pixel SP2 may be provided. Each of the first and second sub-pixels SP1 and SP2 may include the data line DL, the scan line SL, the first power supply line VL1, the second power supply line VL2, first and second active patterns AP1 and AP2, a conductive pattern 350, an anode 250, first and second connection wirings CL1 and CL2, first through sixth contacts CT1, CT2, CT3, CT4, CT5, and CT6, and a connection contact CCT.

A substrate 100 crossing the first sub-pixel SP1 and the second sub-pixel SP2 may be provided. The first sub-pixel SP1 and the second sub-pixel SP2 may be adjacent to each other in a first direction DR1 parallel to a top surface 100u of the substrate 100. For example, the substrate 100 may include a silicon substrate, a glass substrate, a sapphire substrate, or a silicon substrate coated with SiO2 (silicon oxide). However, the substrate 100 is not limited thereto.

A lower semiconductor layer 210 may be provided on the substrate 100. The lower semiconductor layer 210 may include a Group III-V compound semiconductor having a first conductivity type. For example, the lower semiconductor layer 210 may include an n-type GaN.

An upper semiconductor layer 230 may be provided on the lower semiconductor layer 210. The upper semiconductor layer 230 may include a Group III-V compound semiconductor having a second conductivity type that is different from the first conductivity type. For example, the upper semiconductor layer 230 may include a p-type GaN (gallium-nitride).

An active layer 220 may be provided between the lower semiconductor layer 210 and the upper semiconductor layer 230. The active layer 220 may generate light by receiving electrons and holes from the lower semiconductor layer 210 and the upper semiconductor layer 230. The active layer 220 may include a single quantum well (SQW), multiple quantum wells (MQWs), super-lattices (SLs), or a combination thereof. For example, the active layer 220 may include $In_xGa_{1-x}N/GaN(0 \leq x<1)$.

The lower semiconductor layer 210, the active layer 220, and the upper semiconductor layer 230 may include a light-emitting area ER and a non-emitting area IR. The light-emitting area ER may be an area where light is generated. The lower semiconductor layer 210, the active layer 220, and the upper semiconductor layer 230 in the light-emitting area ER may be referred to as a light-emitting device. For example, the light-emitting device may include a micro-LED. For example, the active layer 220 in the light-emitting area ER may generate light. The non-emitting area IR may be an area where light is not generated. For example, the active layer 220 in the non-emitting area IR may not generate light.

A passivation layer 240 may be provided on the upper semiconductor layer 230. The passivation layer 240 may be provided in the non-emitting area IR. The passivation layer 240 may expose the light-emitting area ER. The passivation layer 240 may include an insulating material. For example, the passivation layer 240 may include silicon oxide or silicon nitride. The passivation layer 240 may have a single or multi-layer structure.

The anode 250 may be provided in the light-emitting area ER. The anode 250 may extend from a top surface of the upper semiconductor layer 230 in the light-emitting area ER to a top surface of the passivation layer 240 adjacent to the light-emitting area ER. The anode 250 may expose the top surface of the upper semiconductor layer 230 in the light-emitting area ER. For example, the anode 250 may be electrically connected to the upper semiconductor layer 230 in the light-emitting area ER. For example, the anode 250 may directly contact the upper semiconductor layer 230 in the light-emitting area ER. For example, the anode 250 may include a metal.

A first insulating layer 260, a second insulating layer 310, a third insulating layer 320, a fourth insulating layer 330, and a fifth insulating layer 340 may be sequentially stacked on the passivation layer 240 and the anode 250. For example, each of the first insulating layer 260, the second insulating layer 310, the third insulating layer 320, the fourth insulating layer 330, and the fifth insulating layer 340 may include silicon oxide or silicon nitride.

The first active pattern AP1 may be provided between the second insulating layer 310 and the first insulating layer 260. The first active pattern AP1 may include a channel region C, a source region S, and a drain region D. The source region S and the drain region D may be spaced apart from each other with the channel region C therebetween. For example, the first active pattern AP1 may include polysilicon. The source region S and the drain region D may be formed by implanting impurities into the first active pattern AP1.

The drain region D may be electrically connected to the anode 250 through the first contact CT1, the first connection wiring CL1, and the second contact CT2. Each of the first contact CT1, the first connection wiring CL1, and the second contact CT2 may include a conductive material. The first connection wiring CL1 may be provided between the third insulating layer 320 and the fourth insulating layer 330. The first connection wiring CL1 may extend in a direction parallel to a top surface of the substrate 100. An end portion of the first connection wiring CL1 may overlap the anode 250 and another end portion of the first connection wiring CL1 may overlap the first active pattern AP1 that is adjacent to the first connection wiring CL, when viewed in a third direction DR3 perpendicular to the top surface 100u of the substrate 100.

The first contact CT1 may be provided between the first connection wiring CL1 and the anode 250. The first contact CT1 may extend in the third direction DR3. The first contact CT1 may pass through the first insulating layer 260, the second insulating layer 310, and the third insulating layer 320. The first connection wiring CL1 and the anode 250 may be electrically connected to each other by the first contact CT1.

The second contact CT2 may be provided between the first connection wiring CL1 and the drain region D adjacent to the first connection wiring CL1. The second contact CT2 may extend in the third direction DR3. The second contact CT2 may pass through the second insulating layer 310 and the third insulating layer 320. The first connection wiring CL1 and the drain region D may be electrically connected to each other by the second contact CT2.

A gate electrode GE may be provided on the channel region C. The gate electrode GE may be provided between the second insulating layer 310 and the third insulating layer 320. The gate electrode GE may be a portion of the conductive pattern 350 overlapping the first active pattern AP1 in the third direction DR3. The conductive pattern 350 will be described below. The source region S, the drain region D, the channel region C, the gate electrode GE, and the second insulating layer 310 may constitute a driving transistor.

The source region S may be electrically connected to the first power supply line VL1 by the third contact CT3. For example, each of the third contact CT3 and the first power supply line VL1 may include a conductive material. The first power supply line VL1 will be described below.

The third contact CT3 may be provided between the source region S of the first active pattern AP1 and the first power supply line VL1. The third contact CT3 may pass through the second insulating layer 310, the third insulating layer 320, and the fourth insulating layer 330. For example, the third contact CT3 may extend in the third direction DR3. The source region S of the first active pattern AP1 and the first power supply line VL1 may be electrically connected to each other by the third contact CT3. Because the first sub-pixel SP1 and the second sub-pixel SP2 share the first power supply line VL1 according to an exemplary embodiment, both the third contact CT3 in the first sub-pixel SP1 and the third contact CT3 in the second sub-pixel SP2 may electrically contact the first power supply line VL1.

The first contact CT1, the second contact CT2, the third contact CT3, the first connection wiring CL1, the first active pattern AP1, the gate electrode GE, and the first power supply line VL1 may be provided in the non-emitting area IR.

The conductive pattern 350 may be provided between the second insulating layer 310 and the third insulating layer 320. The conductive pattern 350 may extend in a second direction DR2 parallel to the top surface of the substrate 100. The conductive pattern 350 may have a portion protruding in the first direction DR1. However, a shape of the conductive pattern 350 is not limited thereto. The conductive pattern 350 may be electrically connected to the second active pattern AP2 by the fourth contact CT4, the second connection wiring CL2, and the fifth contact CT5. Each of the fourth contact CT4, the second connection wiring CL2, and the fifth contact CT5 may include a conductive material.

The second active pattern AP2 may be provided between the second insulating layer 310 and the first insulating layer 260. An end portion of the second active pattern AP2 may overlap the second connection wiring CL2 in the third direction DR3. Another end portion of the second active pattern AP2 may overlap the data line DL in the third direction DR3. The second active pattern AP2 may include a source region, a drain region, and a channel region provided between the source region and the drain region.

A gate electrode may be provided on the channel region. The gate electrode may be provided between the second insulating layer 310 and the third insulating layer 320. The gate electrode may be a portion of the scan line SL. For example, the gate electrode may be a portion protruding in the second direction DR2 from a portion of the scan line SL extending in the first direction DR1.

The source region, the drain region, and the channel region in the second active pattern AP2, the gate electrode on the channel region in the second active pattern, and the second insulating layer 310 between the channel region and the gate electrode may constitute a switching transistor.

The second connection wiring CL2 may be provided between the third insulating layer 320 and the fourth insulating layer 330. An end portion of the second connection wiring CL2 may overlap the conductive pattern 350 and the second power supply line VL2 in the third direction DR3. Another end portion of the second connection wiring CL2 may overlap the second active pattern AP2 in the third direction DR3.

The fourth contact CT4 may be provided between the second connection wiring CL2 and the conductive pattern 350. The fourth contact CT4 may pass through the third insulating layer 320. For example, the fourth contact CT4 may extend in the third direction DR3. The second connection wiring CL2 and the conductive pattern 350 may be electrically connected to each other by the fourth contact CT4.

The fifth contact CT5 may be provided between the second connection wiring CL2 and the drain region of the second active pattern AP2. The fifth contact CT5 may pass through the third insulating layer 320 and the second insulating layer 310. For example, the fifth contact CT5 may extend in the third direction DR3. The second connection wiring CL2 and the drain region of the second active pattern AP2 may be electrically connected to each other by the fifth contact CT5.

The data line DL may be provided between the fourth insulating layer 330 and the fifth insulating layer 340. The data line DL may extend in the second direction DR2. A function of the data line DL may be substantially the same as that described with reference to FIGS. 1 through 3.

The data line DL and the second active pattern AP2 may be electrically connected to each other by the sixth contact CT6. For example, the sixth contact CT6 may be provided between the data line DL and another end portion of the second active pattern AP2. The sixth contact CT6 may pass through the fourth insulating layer 330, the third insulating layer 320, and the second insulating layer 310. For example, the sixth contact CT6 may extend in the third direction DR3.

The scan line SL may be provided between the second insulating layer 310 and the third insulating layer 320. As shown in FIG. 6, the scan line SL may be located at substantially the same level as the conductive pattern 350. A distance between the scan line SL and the substrate 100 may be substantially the same as a distance between the conductive pattern 350 and the substrate 100. The scan line SL may extend in the first direction DR1. The scan line SL may pass through the first sub-pixel SP1 and the second sub-pixel SP2. A portion of the scan line SL may extend in the second direction DR2 and may cross the second active pattern AP2. In other words, the portion of the scan line SL may overlap the second active pattern AP2 in the third direction DR3. The portion of the scan line SL may be a gate electrode of the switching transistor.

The first power supply line VL1 may be provided between the fourth insulating layer 330 and the fifth insulating layer 340. As shown in FIG. 7, the first power supply line VL1 may be located at substantially the same level as the data line DL. A distance between the first power supply line VL1 and the substrate 100 may be substantially the same as a distance between the data line DL and the substrate 100. The first power supply line VL1 may extend in the second direction DR2. The first power supply line VL1 may be provided over the first sub-pixel SP1 and the second sub-pixel SP2. A portion of the first power supply line VL1 may be provided in the first sub-pixel SP1. Another portion of the first power supply line VL1 may be provided in the second sub-pixel SP2.

The first sub-pixel SP1 and the second sub-pixel SP2 may share the first power supply line VL1. The first active pattern AP1 of the first sub-pixel SP1 and the first active pattern AP1 of the second sub-pixel SP2 may be electrically connected to the first power supply line VL1. In detail, as shown in FIG. 8, the source regions S of the first active patterns AP1 of the first sub-pixel SP1 and the second sub-pixel SP2 may be electrically connected to the first power supply line VL1 by the third contacts CT3. However, this is merely an example. In another example, two first power supply lines may be respectively provided in the first sub-pixel SP1 and the second sub-pixel SP2.

The first power supply line VL1 may overlap the conductive pattern 350 in the third direction DR3. The first power supply line VL1 and the conductive pattern 350 may face each other in an area where the first power supply line VL1 and the conductive pattern 350 intersect each other. The first power supply line VL1 and the conductive pattern 350 facing each other may constitute the first capacitor C1 (see FIG. 3).

The second power supply line VL2 may be provided between the first insulating layer 260 and the passivation layer 240. As shown in FIG. 5, the second power supply line VL2 may be located at substantially the same level as the anode 250. A distance between the second power supply line VL2 and the substrate 100 may be substantially the same as a distance between the anode 250 and the substrate 100. The second power supply line VL2 may overlap the anode 250 in a direction DR2, which is parallel to the top surface of the substrate 100.

Because the second power supply line VL2 is located at substantially the same level as the anode 250, the second power supply line VL2 may be formed when the anode 250 is formed. The anode 250 may be formed by forming a conductive material film on the passivation layer 240 and then patterning the conductive material film by using a patterning process. During the patterning process, the conductive material film on the passivation layer 240 may not be completely removed and a part of the conductive material film may remain. The part of the conductive material film remaining on the passivation layer 240 may be the second power supply line VL2.

The second power supply line VL2 may extend in the first direction DR1. The second power supply line VL2 may pass through the first sub-pixel SP1 and the second sub-pixel SP2. A portion of the second power supply line VL2 may be provided in the first sub-pixel SP1. Another portion of the second power supply line VL2 may be provided in the second sub-pixel SP2.

The second power supply line VL2 may have a protrusion PP extending in the second direction DR2. The protrusion PP may be provided over the first sub-pixel SP1 and the second sub-pixel SP2. A portion of the protrusion PP may be provided in the first sub-pixel SP1. Another portion of the protrusion PP may be provided in the second sub-pixel SP2. The protrusion PP may not overlap the scan line SL in the third direction DR3. The protrusion PP may be spaced apart from the scan line SL, when viewed in the third direction DR3.

The second power supply line VL2 may overlap the conductive pattern 350 in the third direction DR3. The second power supply line VL2 and the conductive pattern 350 may constitute the second capacitor C2 (see FIG. 3).

The second power supply line VL2 may overlap the first power supply line VL1 in the third direction DR3. The second power supply line VL2 and the first power supply line VL1 may be electrically connected to each other by the connection contact CCT. Although the connection contact CCT is provided on the protrusion PP of the second power supply line VL2, this is merely an example. The connection contact CCT may pass through the first insulating layer 260, the second insulating layer 310, the third insulating layer 320, and the fourth insulating layer 330. The connection contact CCT may extend in the third direction DR3. The first power supply line VL1 and the second power supply line VL2 may have substantially the same voltage.

As illustrated in FIG. 3, the first and second capacitors C1 and C2 of the disclosure may be connected in parallel. The storage capacitor Cst may be an equivalent capacitor of the first and second capacitors C1 and C2 that are connected in parallel. Accordingly, a capacitance of a storage capacitor Cst may be a sum of a capacitance of the first capacitor C1 and a capacitance of the second capacitor C2. As a result, a capacitance of the storage capacitor Cst may be increased.

The first power supply line VL1 and the second power supply line VL2 of the disclosure may be connected in parallel. Accordingly, a total resistance of power supply lines (an equivalent power supply line of a first power supply line and a second power supply line) may be reduced.

Accordingly, the display apparatus 2 of the disclosure may have an increased capacitance of the storage capacitor Cst and a reduced total resistance of power supply lines (an equivalent power supply line of a first power supply line and a second power supply line).

Figure 11:
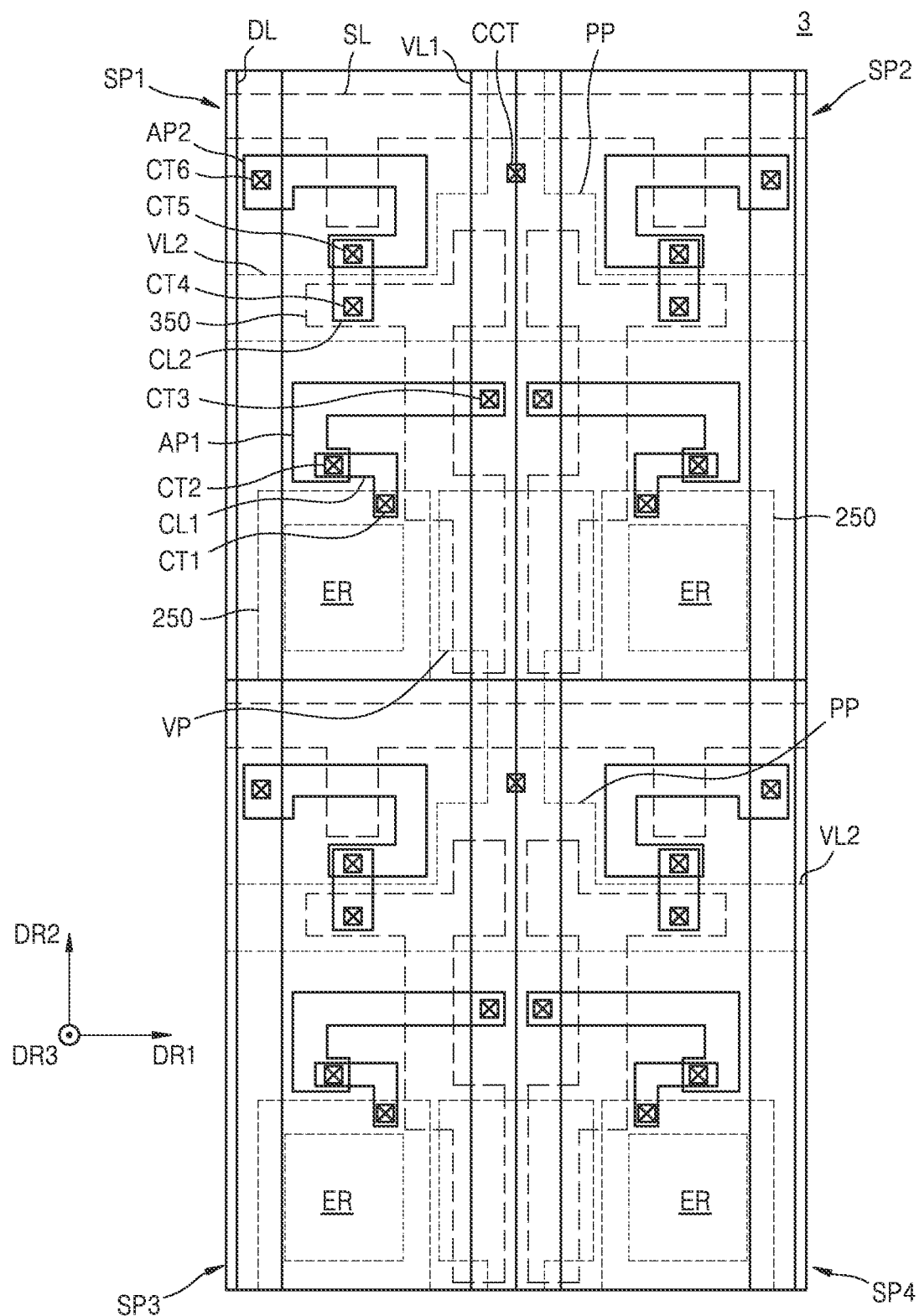
FIG. 11 is a plan view of a display apparatus according to an exemplary embodiment.
Figure 12:
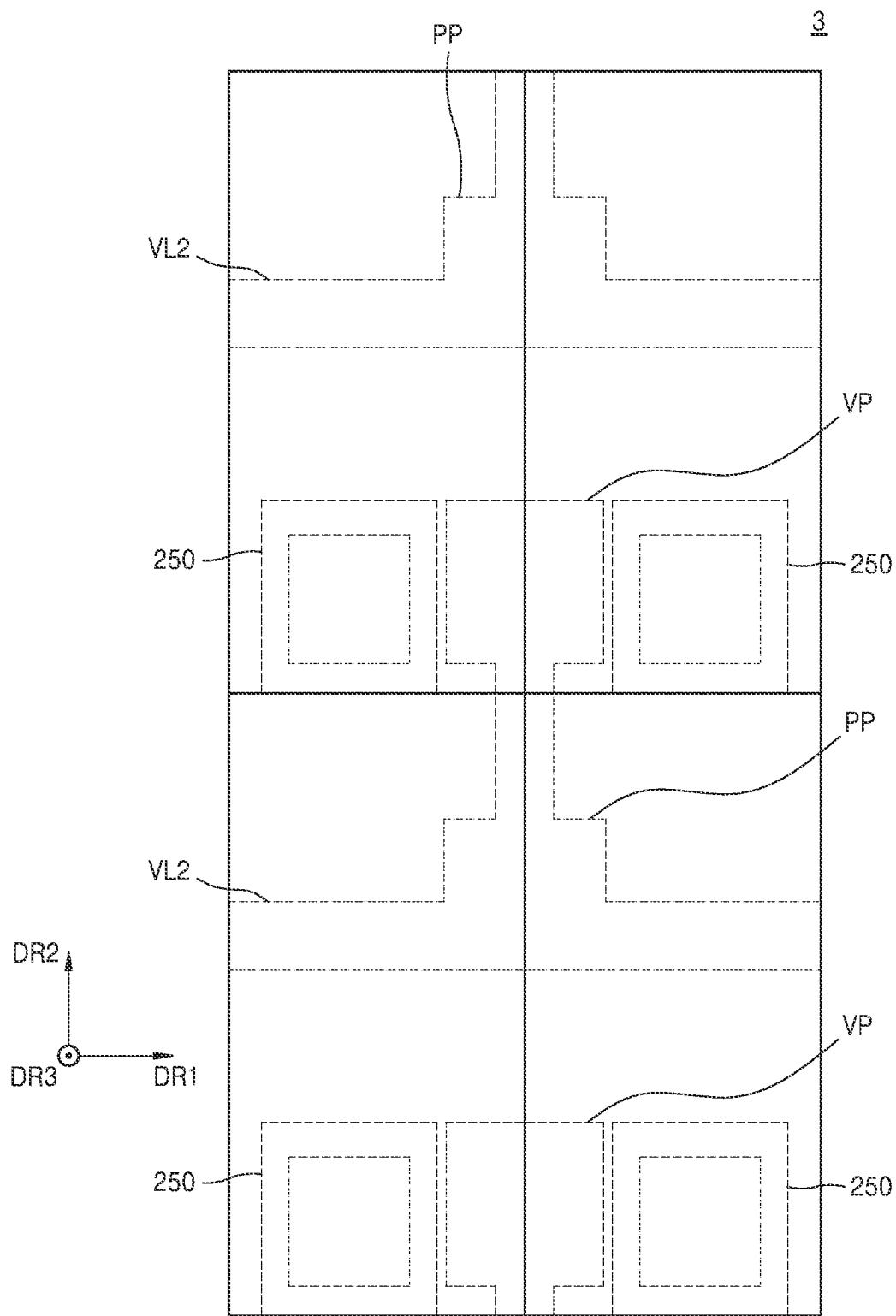
FIG. 12 is a plan view for describing an anode and a second power supply line of the display apparatus of FIG. 11.

FIG. 11 is a plan view of a display apparatus according to an another exemplary embodiment. FIG. 12 is a plan view for describing an anode and a second power supply line of the display apparatus of FIG. 11. For brevity of explanation, substantially the same description as that made with reference to FIGS. 4 through 10 will not be given.

Referring to FIGS. 11 and 12, a display apparatus 3 including the first sub-pixel SP1, the second sub-pixel SP2, the third sub-pixel SP3, and the fourth sub-pixel SP4 that are adjacent to one another may be provided. The first and second sub-pixels SP1 and SP2 may be adjacent to each other in the first direction DR1. The first and third sub-pixels SP1 and SP3 may be adjacent to each other in the second direction DR2. The second and fourth sub-pixels SP2 and SP4 may be adjacent to each other in the second direction DR2. The third and fourth sub-pixels SP3 and SP4 may be adjacent to each other in the first direction DR1.

Each of the first through fourth sub-pixels SP1, SP2, SP3, and SP4 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT may be substantially the same as those described with reference to FIGS. 4 through 10.

According to the exemplary embodiment illustrated in FIGS. 11 and 12, the protrusion PP of the second power supply line VL2 may be provided over two sub-pixels adjacent to each other in the first direction DR1, when viewed in the third direction DR3. For example, in the third sub-pixel SP3 and the fourth sub-pixel SP4, the protrusion PP of the second power supply line VL2 extending in the first direction DR1 may extend into the first sub-pixel SP1 and the second sub-pixel SP2. An end portion VP of the protrusion PP may be provided between the anode 250 of the first sub-pixel SP1 and the anode 250 of the second sub-pixel SP2. The end portion VP of the protrusion PP may be at substantially the same level as the anode 250 of the first sub-pixel SP1 and the anode 250 of the second sub-pixel SP2. The end portion VP of the protrusion PP may overlap the anode 250 of the first sub-pixel SP1 and the anode 250 of the second sub-pixel SP2 in the first direction DR1.

The second power supply line VL2 of the disclosure may overlap the conductive pattern 350 in the third direction DR3 between the anodes 250 adjacent to each other in the first direction DR1 and between the first active pattern AP1 and the second active pattern AP2. Accordingly, an area where the second power supply line VL2 and the conductive pattern 350 overlap each other in the third direction DR3 may be increased. As a result, a storage capacitance may be increased.

As the area of the second power supply line VL2 of the disclosure is increased, a resistance of the second power supply line VL2 may be reduced. Accordingly, a total resistance of power supply lines may be reduced.

The disclosure may provide the display apparatus 3 having an increased capacitance of the storage capacitor Cst (see FIG. 3) and a reduced total resistance of power supply lines (an equivalent power supply line of a first power supply line and a second power supply line).

Figure 13:
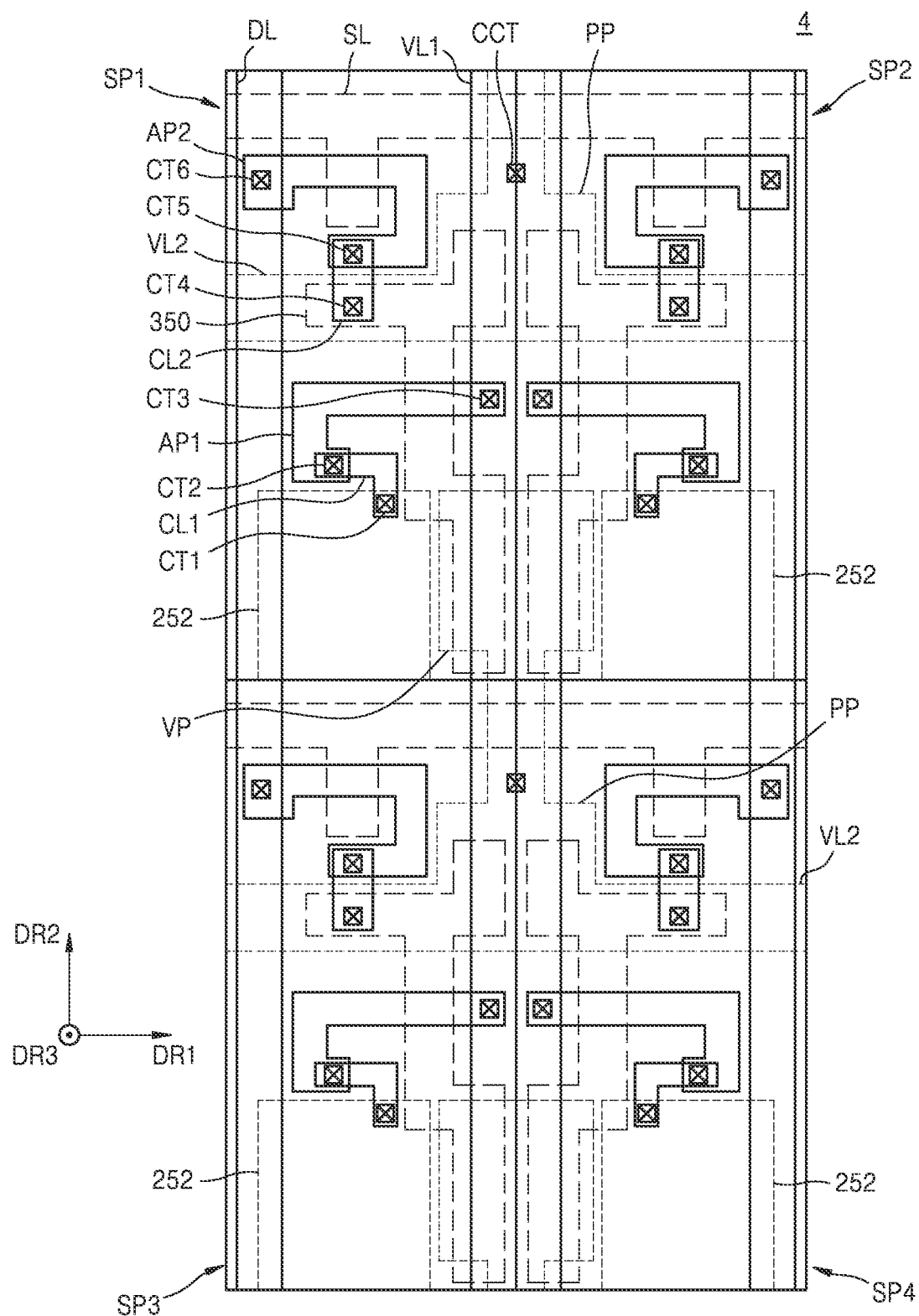
FIG. 13 is a plan view of a display apparatus according to an exemplary embodiment.
Figure 14:
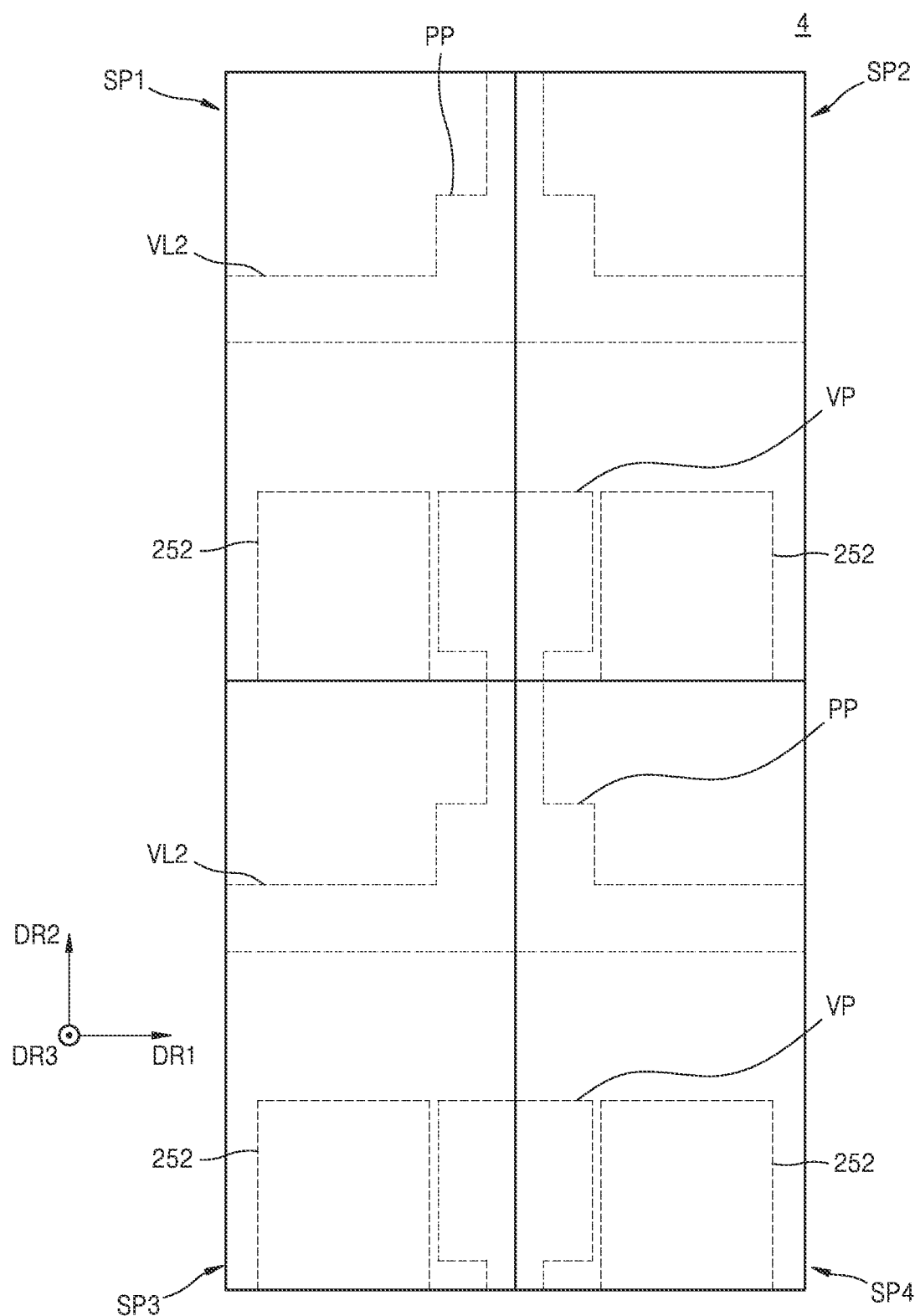
FIG. 14 is a plan view for describing an anode and a second power supply line of the display apparatus of FIG. 13.

FIG. 13 is a plan view of a display apparatus according to an another exemplary embodiment. FIG. 14 is a plan view for describing an anode and a second power supply line of the display apparatus of FIG. 13. For brevity of explanation, substantially the same description as that made with reference to FIGS. 11 and 12 will not be given.

Referring to FIGS. 13 and 14, a display apparatus 4 including the first sub-pixel SP1, the second sub-pixel SP2, the third sub-pixel SP3, and the fourth sub-pixel SP4 that are adjacent to one another may be provided. Each of the first through fourth sub-pixels SP1, SP2, SP3, and SP4 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the second power supply line VL2, the first and second active patterns AP1 and AP2, the conductive pattern 350, the first and second connection wirings CL1 and CL2, the first through sixth contacts CT1, CT2, CT3, CT4, CT5, and CT6, and the connection contact CCT of each of the first through fourth sub-pixels SP1, SP2, SP3, and SP4 may be substantially the same as those described with reference to FIGS. 11 and 12.

Unlike in FIGS. 11 and 12, the anode 250 may entirely cover the light-emitting area ER. The anode 250 may reflect light. For example, light generated in the light-emitting area ER and traveling toward the upper semiconductor layer 230 (see FIG. 8) may be reflected by the anode 250 to the lower semiconductor layer 210 (see FIG. 8). Accordingly, light generated in the light-emitting area ER may be emitted through a bottom surface of the lower semiconductor layer 210 (see FIG. 8). In an exemplary embodiment, at least a portion of the substrate 100 of FIG. 8 may be removed from the lower semiconductor layer 210. In an exemplary embodiment, uneven patterns for light extraction may be provided on the bottom surface of the lower semiconductor layer 210 (see FIG. 8).

The disclosure may provide the display apparatus 4 having an increased capacitance of the storage capacitor Cst (see FIG. 3) and a reduced total resistance of power supply lines (an equivalent power supply line of a first power supply line and a second power supply line).

Figure 15:
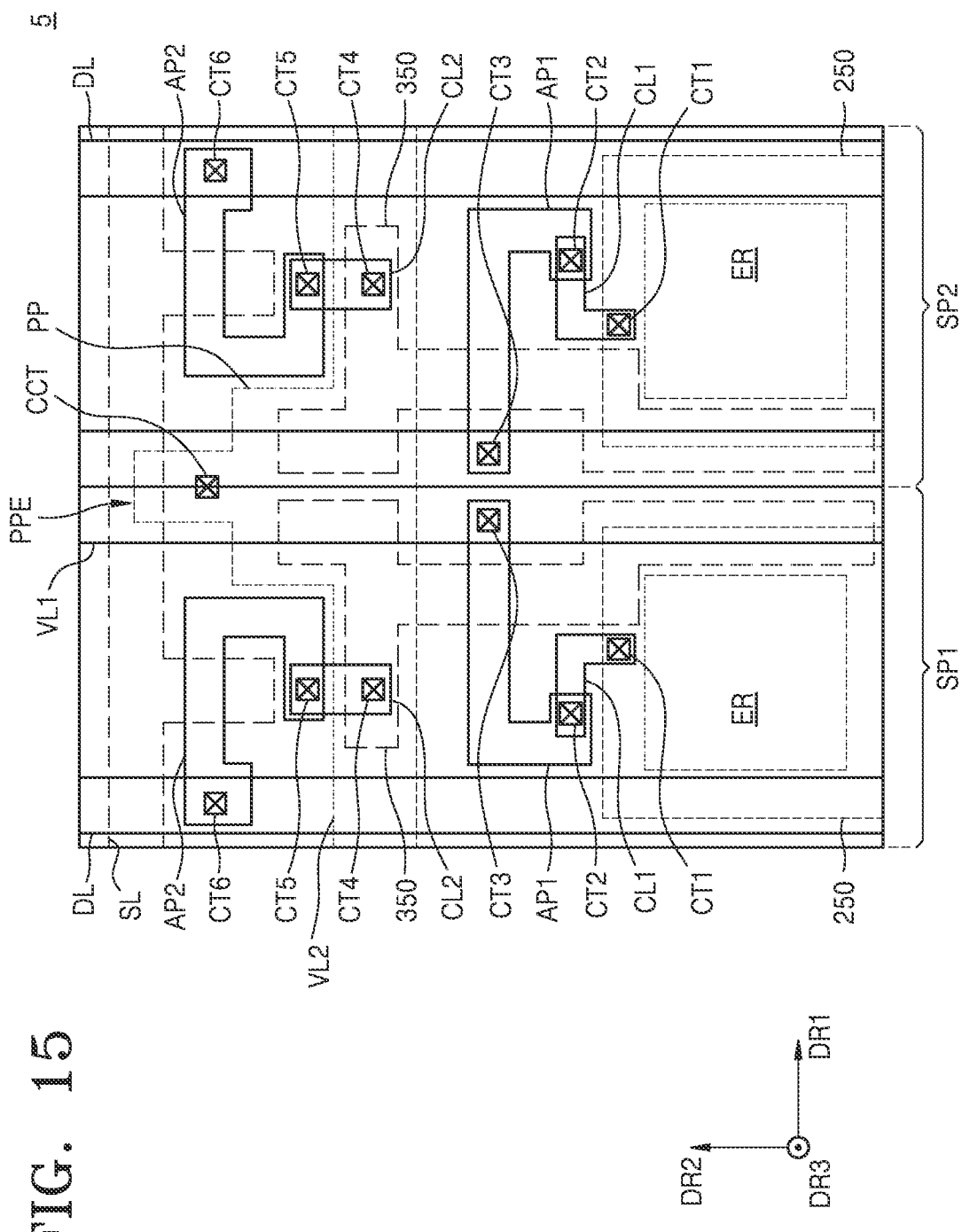
FIG. 15 is a plan view of a display apparatus according to an exemplary embodiment.

FIG. 15 is a plan view of a display apparatus according to an another exemplary embodiment. For brevity of explanation, substantially the same description as that made with reference to FIGS. 4 through 10 will not be given.

Referring to FIG. 15, a display apparatus 5 including the first sub-pixel SP1, the second sub-pixel SP2, the third sub-pixel SP3, and the fourth sub-pixel SP4 that are adjacent to one another may be provided. Each of the first through fourth sub-pixels SP1, SP2, SP3, and SP4 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT of each of the first through fourth sub-pixels SP1, SP2, SP3, and SP4 may be substantially the same as those described with reference to FIGS. 4 through 10.

Unlike in FIGS. 4 through 10, the protrusion PP of the second power supply line VL2 may extend in the second direction DR2 and may overlap the scan line SL in the third direction DR3. The protrusion PP may be located opposite to the first power supply line VL1 with the scan line SL therebetween. One end PPE of the protrusion PP in the second direction DR2 may be located in the scan line SL, when viewed in the third direction DR3. The area of the second power supply line VL2 may be increased, and a resistance of the second power supply line VL2 may be reduced.

The disclosure may provide the display apparatus 5 having an increased capacitance of the storage capacitor Cst (see FIG. 3) and a reduced total resistance of power supply lines (an equivalent power supply line of a first power supply line and a second power supply line).

Figure 16:
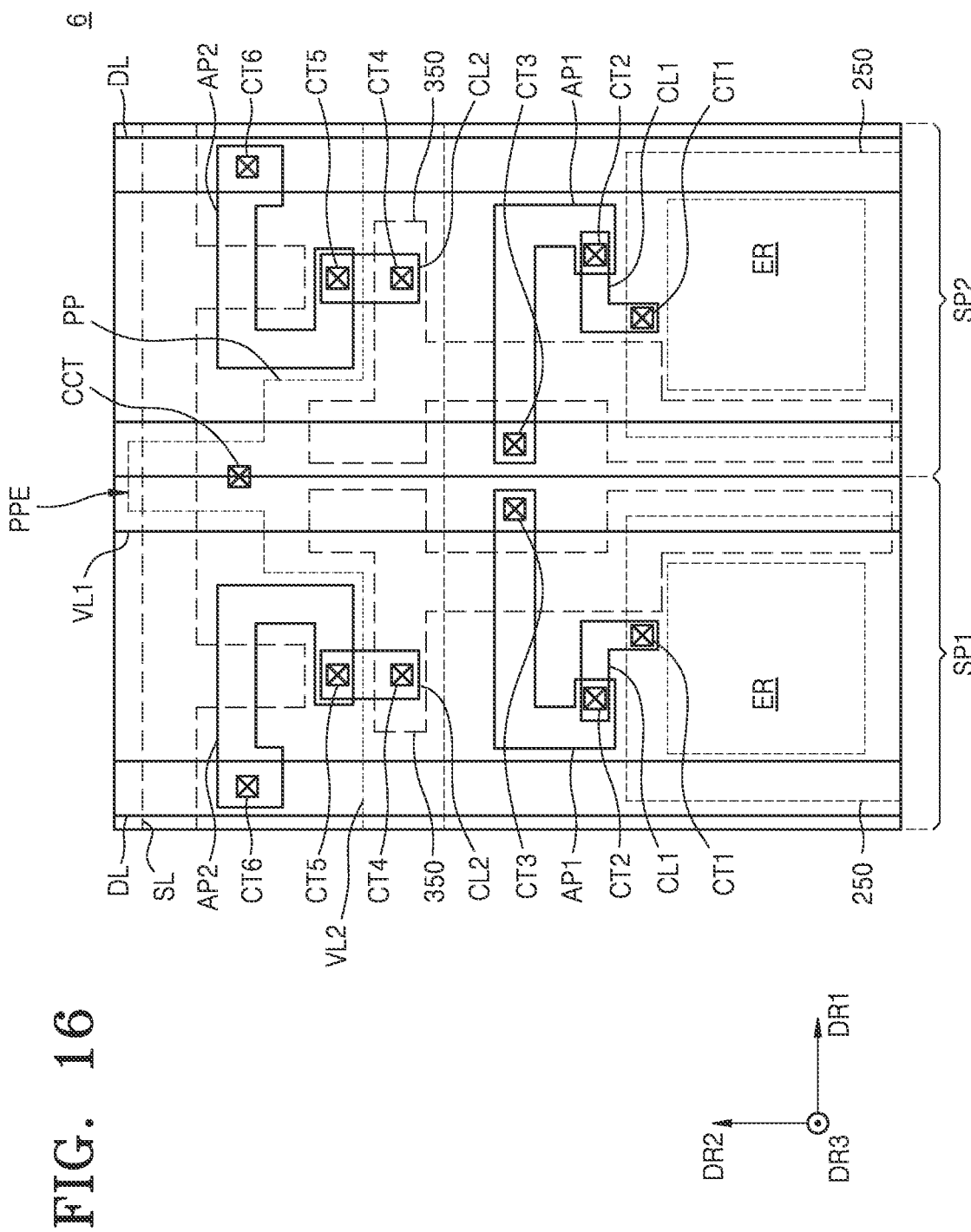
FIG. 16 is a plan view of a display apparatus according to an exemplary embodiment.

FIG. 16 is a plan view of a display apparatus according to an another exemplary embodiment. For brevity of explanation, substantially the same description as that made with reference to FIG. 4 will not be given.

Referring to FIG. 16, a display apparatus 6 including the first sub-pixel SP1 and the second sub-pixel SP2 that are adjacent to each other may be provided. Each of the first and second sub-pixels SP1 and SP2 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT may be substantially the same as those described with reference to FIGS. 4 through 10.

Unlike in FIGS. 4 through 10, the protrusion PP of the second power supply line VL2 may extend in the second direction DR2 to pass through the scan line SL, when viewed in the third direction DR3. The protrusion PP may be located opposite to the first power supply line VL1 with the scan line SL therebetween. The one end PPE of the protrusion PP of the second power supply line VL2 may be located opposite to the connection contact CCT with the scan line SL therebetween, when viewed in the third direction DR3. The area of the second power supply line VL2 may be increased, and a resistance of the second power supply line VL2 may be reduced.

The disclosure may provide the display apparatus 6 having an increased capacitance of the storage capacitor Cst (see FIG. 3) and a reduced total resistance of power supply lines (an equivalent power supply line of a first power supply line and a second power supply line).

Figure 17:
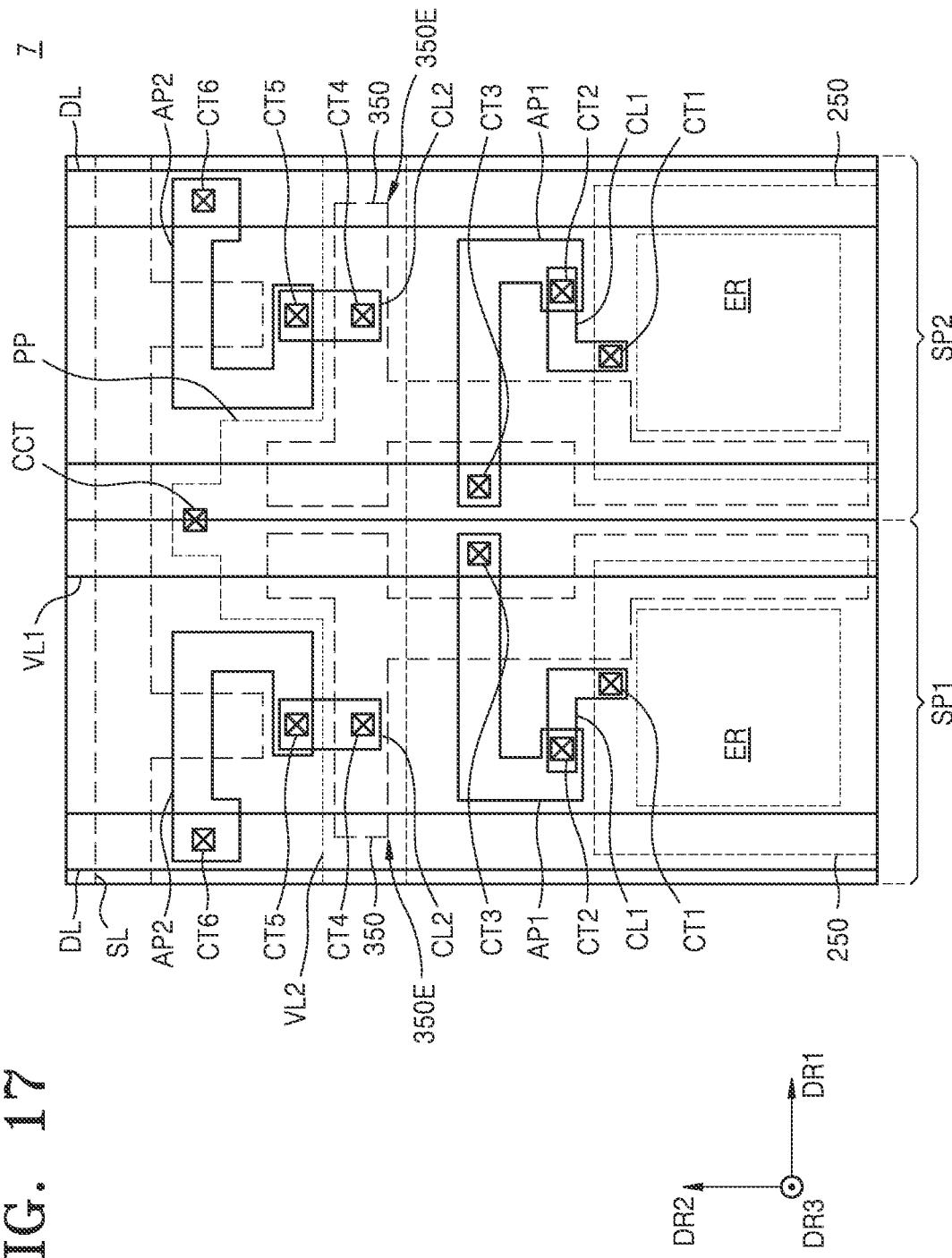
FIG. 17 is a plan view of a display apparatus according to an exemplary embodiment.

FIG. 17 is a plan view of a display apparatus according to an another exemplary embodiment. For brevity of explanation, substantially the same description as that made with reference to FIGS. 4 through 10 will not be given.

Referring to FIG. 17, a display apparatus 7 including the first sub-pixel SP1 and the second sub-pixel SP2 that are adjacent to each other may be provided. Each of the first and second sub-pixels SP1 and SP2 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the first and second active patterns AP1 and AP2, the anode 250, the first and second connection wirings CL1 and CL2, the first through sixth contacts CT1, CT2, CT3, CT4, CT5, and CT6, and the connection contact CCT may be substantially the same as those described with reference to FIGS. 4 through 10.

Unlike in FIGS. 4 through 10, the conductive pattern 350 may overlap the data line DL in the third direction DR3. The conductive pattern 350 may be located between the second power supply line VL2 and the data line DL. An end portion 350E of the conductive pattern 350 may be located in the data line DL, when viewed in the third direction DR3. An area where the conductive pattern 350 and the second power supply line VL2 overlap each other in the third direction DR3 may be increased, and a capacitance of the second capacitor C2 (see FIG. 3) may be increased.

The disclosure may provide the display apparatus 7 having an increased capacitance of the storage capacitor Cst (see FIG. 3) and a reduced total resistance of power supply lines (an equivalent power supply line of a first power supply line and a second power supply line).

Figure 18:
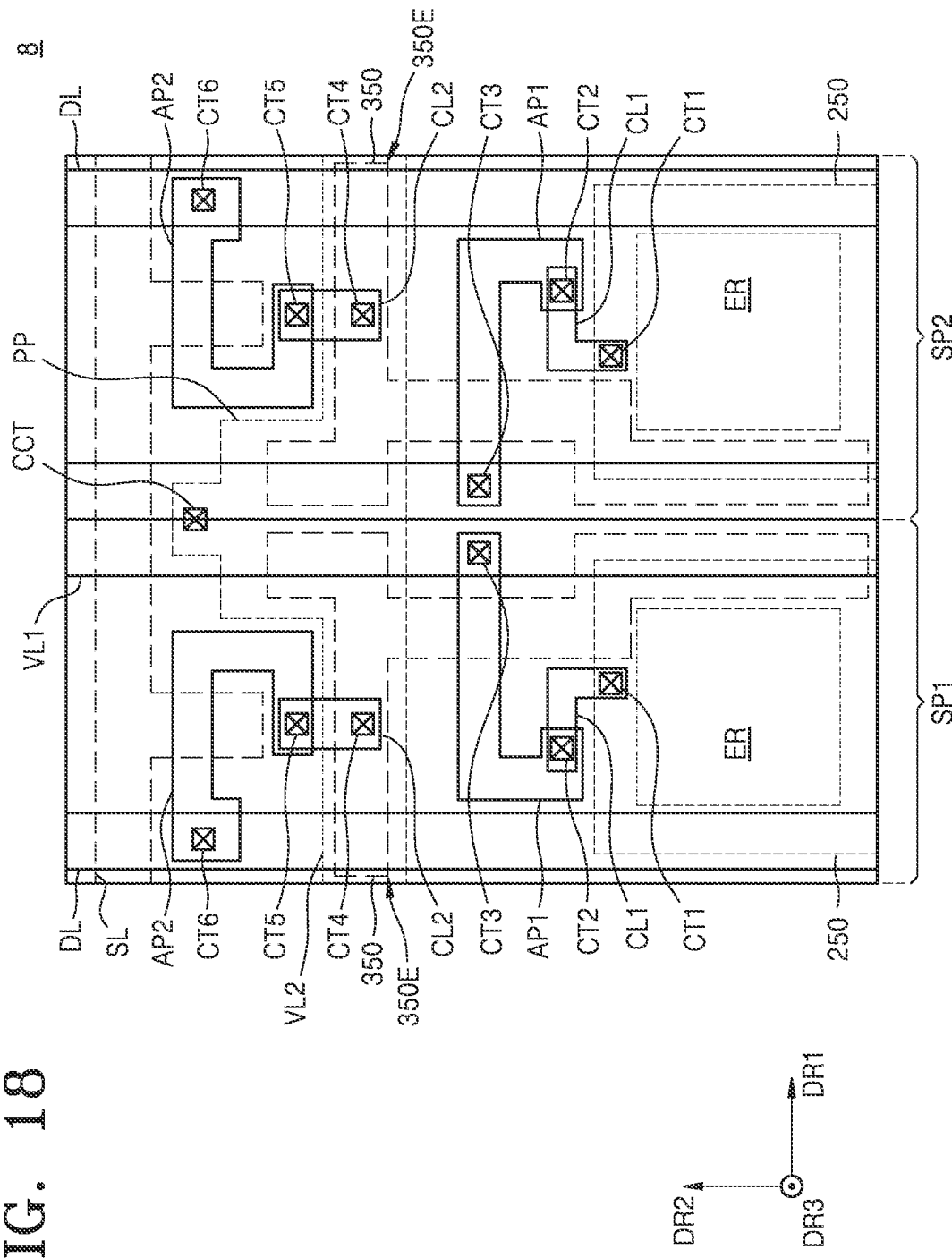
FIG. 18 is a plan view of a display apparatus according to an exemplary embodiment.

FIG. 18 is a plan view of a display apparatus according to an another exemplary embodiment. For brevity of explanation, substantially the same description as that made with reference to FIGS. 4 through 10 will not be given.

Referring to FIG. 18, a display apparatus 8 including the first sub-pixel SP1 and the second sub-pixel SP2 that are adjacent to each other may be provided. Each of the first and second sub-pixels SP1 and SP2 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the first and second active patterns AP1 and AP2, the anode 250, the first and second connection wirings CL1 and CL2, the first through sixth contacts CT1, CT2, CT3, CT4, CT5, and CT6, and the connection contact CCT may be substantially the same as those described with reference to FIGS. 4 through 10.

Unlike in FIGS. 4 through 10, the conductive pattern 350 may extend in the second direction DR2 and may pass through the data line DL, when viewed in the third direction DR3. The conductive pattern 350 may overlap the data line DL in the third direction DR3. The end portion 350E of the conductive pattern 350 may be located opposite to the fourth contact CT4 with the data line DL therebetween, when viewed in the third direction DR3. An area where the conductive pattern 350 and the second power supply line VL2 overlap each other in the third direction DR3 may be increased, and a capacitance of the second capacitor C2 (see FIG. 3) may be increased.

The disclosure may provide the display apparatus 8 having an increased capacitance of the storage capacitor Cst (see FIG. 3) and a reduced total resistance of power supply lines (an equivalent power supply line of a first power supply line and a second power supply line).

Figure 19:
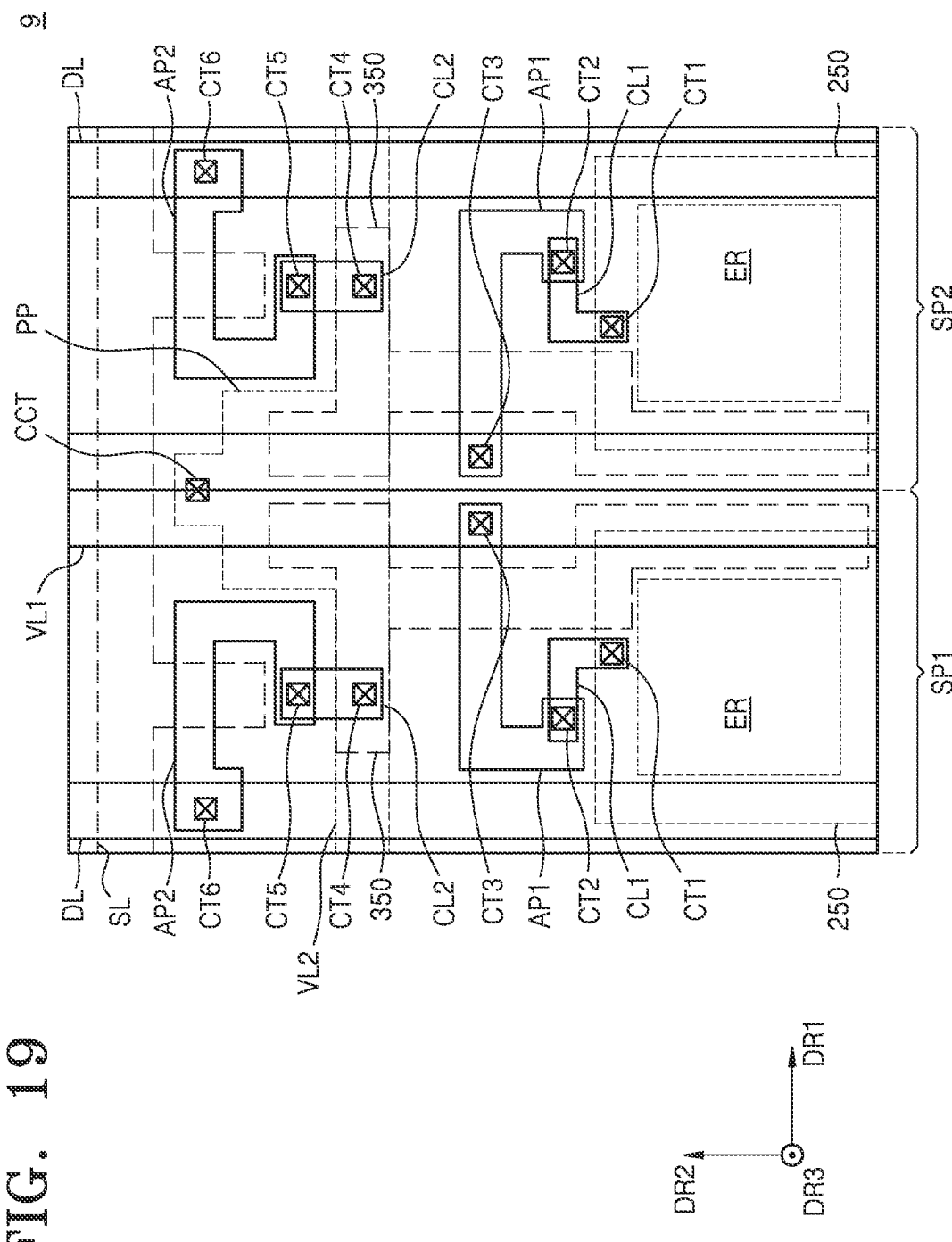
FIG. 19 is a plan view of a display apparatus according to an exemplary embodiment.

FIG. 19 is a plan view of a display apparatus according to an another exemplary embodiment. For brevity of explanation, substantially the same description as that made with reference to FIGS. 4 through 10 will not be given.

Referring to FIG. 19, a display apparatus 9 including the first sub-pixel SP1 and the second sub-pixel SP2 that are adjacent to each other may be provided. Each of the first and second sub-pixels SP1 and SP2 may include the data line DL, the scan line SL, the first power supply line VL1, the second power supply line VL2, the first and second active patterns AP1 and AP2, the conductive pattern 350, the anode 250, the first and second connection wirings CL1 and CL2, the first through sixth contacts CT1, CT2, CT3, CT4, CT5, and CT6, and the connection contact CCT. The data line DL, the scan line SL, the first power supply line VL1, the first and second active patterns AP1 and AP2, the anode 250, the first and second connection wirings CL1 and CL2, the first through sixth contacts CT1, CT2, CT3, CT4, CT5, and CT6, and the connection contact CCT may be substantially the same as those described with reference to FIGS. 4 through 10.

Unlike in FIGS. 4 through 10, a width of the second power supply line VL2 extending in the first direction DR1 may be substantially the same as a width of the conductive pattern 350 overlapping the second power supply line VL2. A width of the second power supply line VL2 may be a size of the second power supply line VL2 in the second direction DR2. A width of the conductive pattern 350 may be a size of the conductive pattern 350 in the second direction DR2.

The disclosure may provide the display apparatus 9 having an increased capacitance of the storage capacitor Cst (see FIG. 3) and a reduced total resistance of power supply lines (an equivalent power supply line of a first power supply line and a second power supply line).

The disclosure may provide a display apparatus having an increased capacitance of a storage capacitor and a reduced resistance of a power supply line.

It should be understood that one or more exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a light-emitting device provided on the substrate;
   a driving transistor provided on the substrate and configured to control the light-emitting device;

a first power supply line provided on the substrate and electrically connected to a source region of the driving transistor;

a conductive pattern provided on the substrate and electrically connected to a gate electrode of the driving transistor;

a second power supply line provided on the substrate and electrically connected to the first power supply line, a lower semiconductor layer provided on the substrate;

an upper semiconductor layer provided on the lower semiconductor layer;

an emission layer provided between the lower semiconductor layer and the upper semiconductor layer; and an anode provided on the upper semiconductor layer, wherein the conductive pattern and the first power supply line constitute a first capacitor, wherein the conductive pattern and the second power supply line constitute a second capacitor, wherein the first capacitor and the second capacitor are connected in parallel, and wherein the anode overlaps the second power supply line in a direction parallel to a top surface of the substrate.

2. The display apparatus of claim 1, wherein the anode extends along a top surface of the upper semiconductor layer and has an opening that exposes the top surface of the upper semiconductor layer.

3. The display apparatus of claim 1, wherein the anode entirely covers a top surface of the upper semiconductor layer.

4. The display apparatus of claim 1, wherein the driving transistor comprises an active pattern comprising the source region and a drain region, wherein, in a direction perpendicular to a top surface of the substrate, the active pattern and the second power supply line are spaced apart from each other.

5. The display apparatus of claim 1, further comprising a data line extending in a direction parallel to the first power supply line, wherein, in a direction perpendicular to a top surface of the substrate, the conductive pattern is spaced apart from the data line.

6. The display apparatus of claim 1, further comprising a data line extending in a direction parallel to the first power supply line, wherein the conductive pattern overlaps the data line in a direction perpendicular to a top surface of the substrate.

7. The display apparatus of claim 6, wherein, in the direction perpendicular to the top surface of the substrate, the conductive pattern crosses the data line.

8. The display apparatus of claim 1, further comprising:

a data line provided on the substrate and extending in a first direction parallel to a top surface of the substrate;

a scan line provided on the substrate and extending in a second direction intersecting the first direction; and a switching transistor device provided in an area of the substrate where the data line and the scan line intersect each other, wherein the data line is electrically connected to a source region of the switching transistor device, the scan line is electrically connected to a gate electrode of the switching transistor device, and the conductive pattern is electrically connected to a drain region of the switching transistor device.

9. The display apparatus of claim 8, wherein, in a third direction perpendicular to the top surface of the substrate, the second power supply line is spaced apart from the scan line.

10. The display apparatus of claim 8, wherein the second power supply line overlaps the scan line in a third direction perpendicular to the top surface of the substrate.

11. The display apparatus of claim 10, wherein, in the third direction perpendicular to the top surface of the substrate, the second power supply line crosses the scan line.

12. The display apparatus of claim 1, wherein a width of a portion of the conductive pattern is the same as a width of the second power supply line overlapping the portion of the conductive pattern in a direction perpendicular to a top surface of the substrate.

13. A display apparatus comprising:

sub-pixels arranged in a matrix form, wherein each of the sub-pixels comprises:

a light-emitting device;

a driving transistor configured to control the light-emitting device;

a first power supply line extending in a first direction;

a second power supply line extending in a second direction different from the first direction, a lower semiconductor layer provided on a substrate;

an upper semiconductor layer provided on the lower semiconductor layer;

an emission layer provided between the lower semiconductor layer and the upper semiconductor layer; and an anode provided on the upper semiconductor layer, wherein the first power supply line is electrically connected to a source region of the driving transistor, and wherein, in a third direction perpendicular to the first and the second direction, the second power supply line is between the driving transistor and the light-emitting device, and the second power supply line is electrically connected to the first power supply line, wherein each of the sub-pixels further comprises a conductive pattern electrically connected to a gate electrode of the driving transistor, wherein the conductive pattern and the first power supply line face each other to constitute a first capacitor, wherein the conductive pattern and the second power supply line face each other to constitute a second capacitor, wherein the first capacitor and the second capacitor are connected in parallel, and wherein the anode overlaps the second power supply line in a direction parallel to a top surface of the substrate.

14. The display apparatus of claim 13, wherein the conductive pattern overlaps at least one of the first power supply line and the second power supply line in the third direction.

15. The display apparatus of claim 13, wherein one pair of sub-pixels, from among the sub-pixels, that are adjacent to each other in the second direction share one first power supply line.

16. The display apparatus of claim 13, wherein the second power supply line comprises a protrusion extending in the first direction, wherein the protrusion is provided in a first pair of sub-pixels, from among the sub-pixels, that are adjacent to each other in the second direction.

17. The display apparatus of claim 16, wherein the protrusion is provided in a second pair of sub-pixels, from among the sub-pixels, that are adjacent to each other in the first direction.

18. The display apparatus of claim 17, wherein the protrusion is provided between light-emitting devices of the first pair of sub-pixels that are adjacent to each other in the second direction.

19. The display apparatus of claim 17, wherein the light-emitting device comprises:
 a lower semiconductor layer;
 an upper semiconductor layer provided on the lower semiconductor layer;
 an active layer provided between the lower semiconductor layer and the upper semiconductor layer; and
 an anode provided on the upper semiconductor layer,
 wherein the anode and the protrusion overlap each other in the second direction.

20. The display apparatus of claim 19, wherein the anode and the second power supply line are located at a same level.

* * * * *